US012727453B2

(12) United States Patent
Liu

(10) Patent No.: US 12,727,453 B2
(45) Date of Patent: Sep. 1, 2026

(54) ISOLATION STRUCTURES IN SEMICONDUCTOR DEVICES

(71) Applicant: Taiwan Semiconductor Manufacturing Company, Ltd., Hsinchu (TW)

(72) Inventor: Chien-Hsuan Liu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 325 days.

(21) Appl. No.: 18/382,273

(22) Filed: Oct. 20, 2023

(65) Prior Publication Data

US 2025/0132190 A1 Apr. 24, 2025

(51) Int. Cl.

*H10W 10/17* (2026.01)
*H10D 30/01* (2025.01)
*H10D 84/83* (2025.01)
*H10W 10/00* (2026.01)

(52) U.S. Cl.

CPC ........ *H10W 10/014* (2026.01); *H10D 30/024* (2025.01); *H10D 84/834* (2025.01); *H10W 10/17* (2026.01)

(58) Field of Classification Search

CPC ............................ H10W 10/17; H10W 10/014
See application file for complete search history.

(56) References Cited

U.S. PATENT DOCUMENTS

| | | | | |
|---|---|---|---|---|
| 9,064,932 | B1 * | 6/2015 | Pham | H10D 84/0135 |
| 2017/0033196 | A1 * | 2/2017 | Greene | H10W 10/014 |
| 2017/0084723 | A1 * | 3/2017 | Greene | H10D 64/017 |
| 2018/0069000 | A1 * | 3/2018 | Bergendahl | H10D 84/834 |
| 2018/0108770 | A1 * | 4/2018 | Cheng | H10D 30/62 |
| 2019/0164765 | A1 * | 5/2019 | Yeoh | H10D 64/017 |
| 2019/0371912 | A1 * | 12/2019 | Bao | H10D 64/017 |
| 2023/0361221 | A1 * | 11/2023 | Wu | H10D 30/6755 |

* cited by examiner

*Primary Examiner* — Christopher A Johnson
(74) *Attorney, Agent, or Firm* — Sterne, Kessler, Goldstein & Fox P.L.L.C.

(57) ABSTRACT

A semiconductor device and a method of fabricating the semiconductor device are disclosed. The method includes forming a fin structure having a first fin portion and a second fin portion, forming a first dielectric layer on the substrate and on sidewalls of the first fin portion, forming a second dielectric layer on the first dielectric layer, performing an oxidation process on the second fin portion to form an oxide layer, depositing a gate dielectric layer on the oxide layer and on the second dielectric layer, depositing a gate conductive layer on the gate dielectric layer, and forming an isolation structure extending through the gate conductive layer, the gate dielectric layer, and the second dielectric layer.

20 Claims, 18 Drawing Sheets

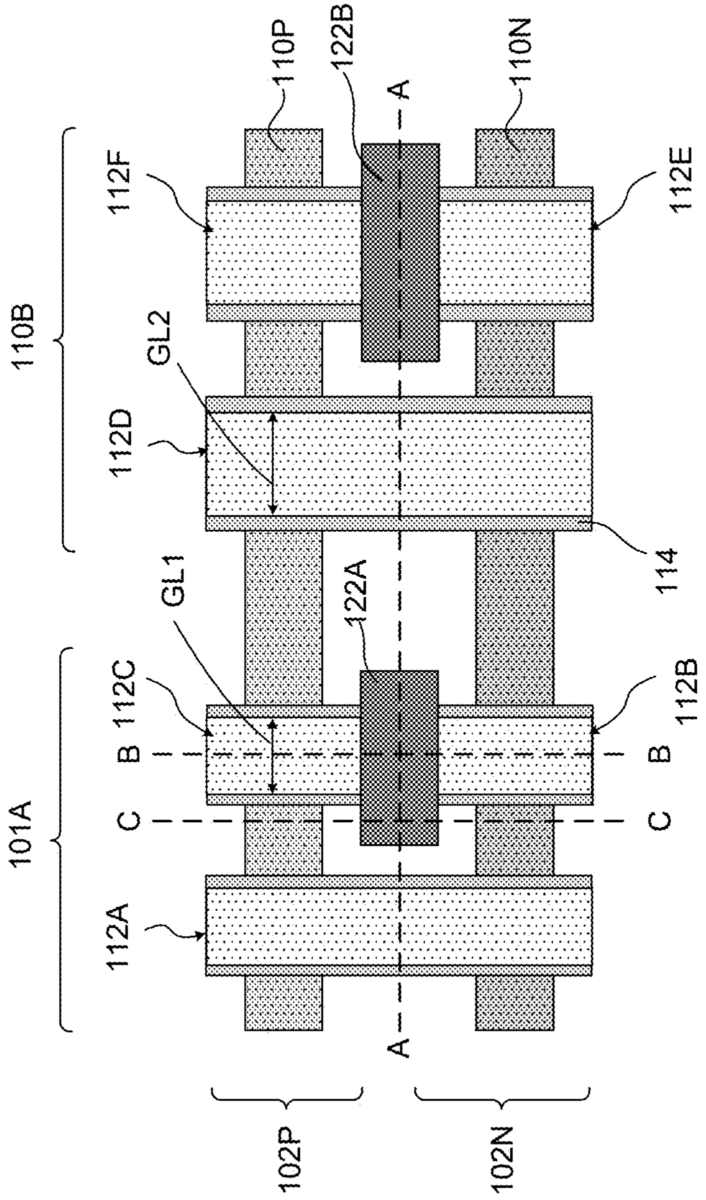
Fig. 1B
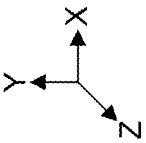

ISOLATION STRUCTURES IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 1B illustrates a top-down view of a semiconductor device with isolation structures, in accordance with some embodiments.

FIGS. 6-11, 12A-14A, 12B-14B, and 12C-14C illustrate cross-sectional views of a semiconductor device with isolation structures at various stages of its fabrication process, in accordance with some embodiments.

FIGS. 16-19, 20A-22A, 20B-22B, and 20C-22C illustrate cross-sectional views of another semiconductor device with isolation structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
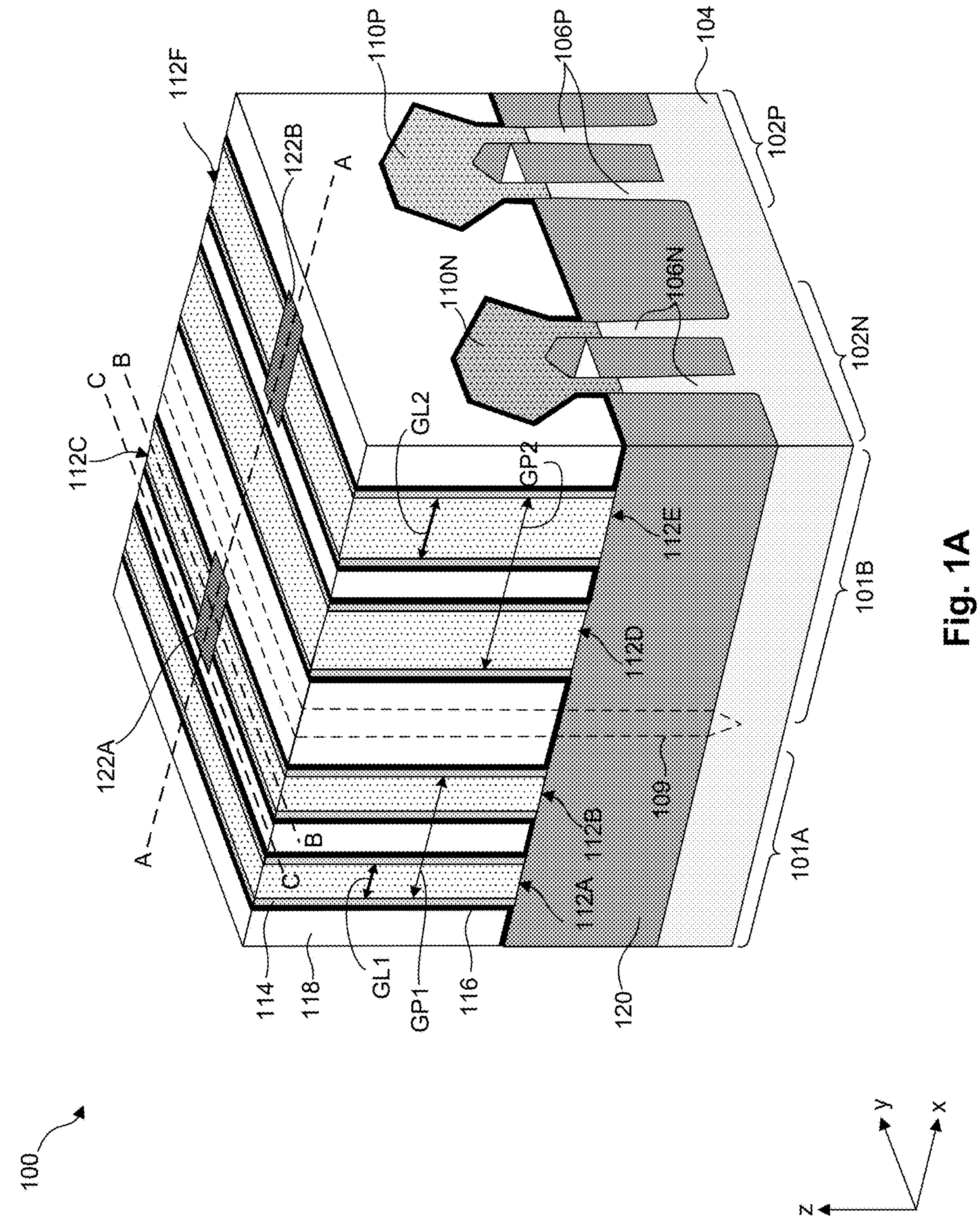
FIG. 1A illustrates an isometric view of a semiconductor device with isolation structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., +1%, +2%, +3%, +4%, +5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Gate structures in semiconductor devices with multiple finFETs can be formed extending across fin structures of the multiple finFETs. The formation of the gate structures can be followed by a patterning process to "cut" one or more of the gate structures into shorter gate structures. The patterning process can remove redundant gate portions of the one or more gate structures to form one or more isolation trenches (also referred to as "metal cuts") between the finFETs and separate the gate structures into shorter sections. This process is referred to as a cut-metal-gate (CMG) process. Subsequently, the isolation trenches can be filled with a dielectric material, such as silicon nitride (SiN) to form isolation structures, which can electrically isolate the separated gate structures.

One of the challenges of forming the isolation structures is controlling the etch depth of the isolation trenches during the CMG process. The isolation trenches can extend vertically into the substrate of the finFETs during the CMG process. The etching of the substrate during the CMG process can damage the substrate, thus degrading the performance and reliability of the finFETs. In addition, the dielectric layers deposited in the isolation trenches to form the isolation structures can induce charged carriers into the substrate. The charged carriers can form current leakage paths, through the substrate, between p-wells and n-wells of adjacent finFETs, thus degrading the performance of the finFETs.

To address the abovementioned challenges, the present disclosure provides example semiconductor devices (e.g., finFETs) with etch control layers between the substrate and gate structures and example methods for fabricating the semiconductor devices. The etch control layer can prevent the isolation trenches from extending into the substrate through shallow trench isolation (STI) regions during the formation of the isolation structures in the CMG process. In some embodiments, the etch control layer can be disposed directly on the STI regions and bottom surfaces of the isolation structures can be disposed in the etch control layer or in the STI regions. In some embodiments, the etch control layer can be disposed directly on the substrate and bottom surfaces of the isolation structures can be disposed in the etch control layer. In some embodiments, the etch control layer can have an etch selectivity lower than that of the gate structures to reduce the etching rate of the CMG process after the etching of the gate structures. Reducing the etching rate after the etching of the gate structures can achieve a more precise control of the etch depth of the isolation trenches in the etch control layer and/or in the STI regions compared to that achieved in semiconductor devices without the etch control layers.

Figure 2A:
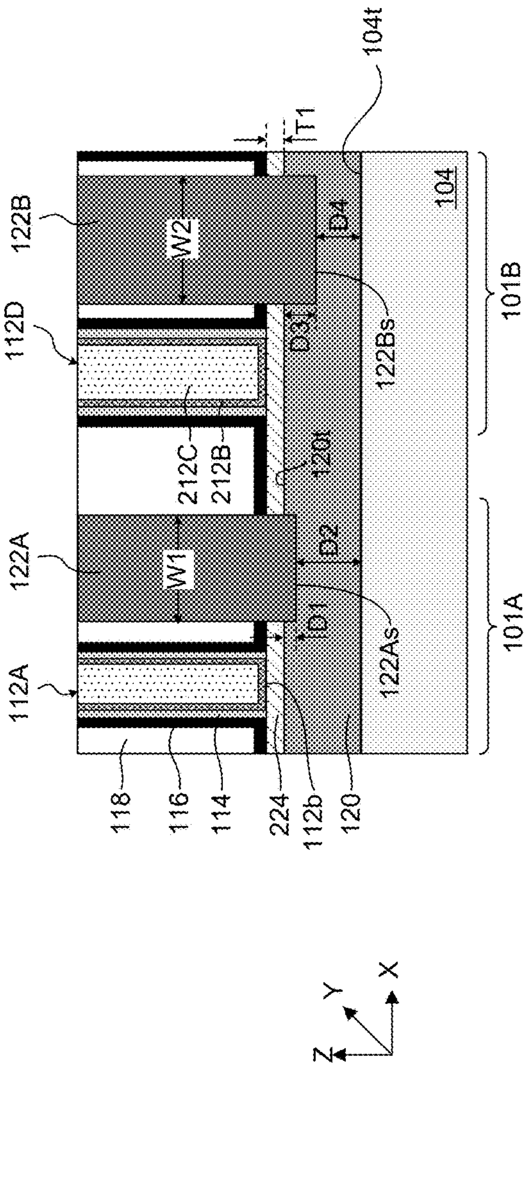
FIGS. 2A-2C illustrate cross-sectional views of a semiconductor device with isolation structures, in accordance with some embodiments.
Figure 2B:
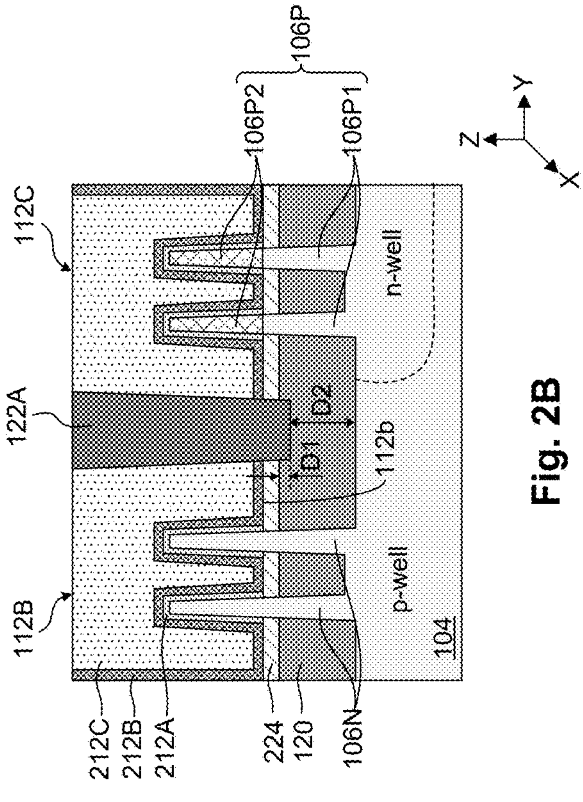
Figure 2C:
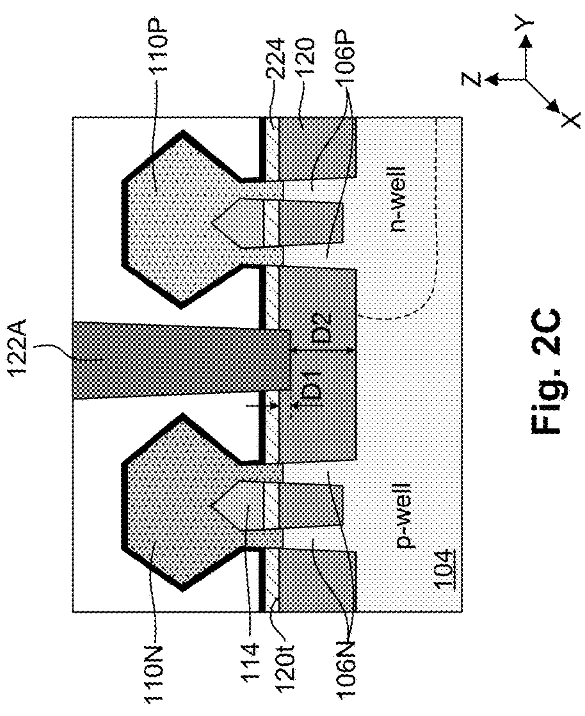
Figure 3A:
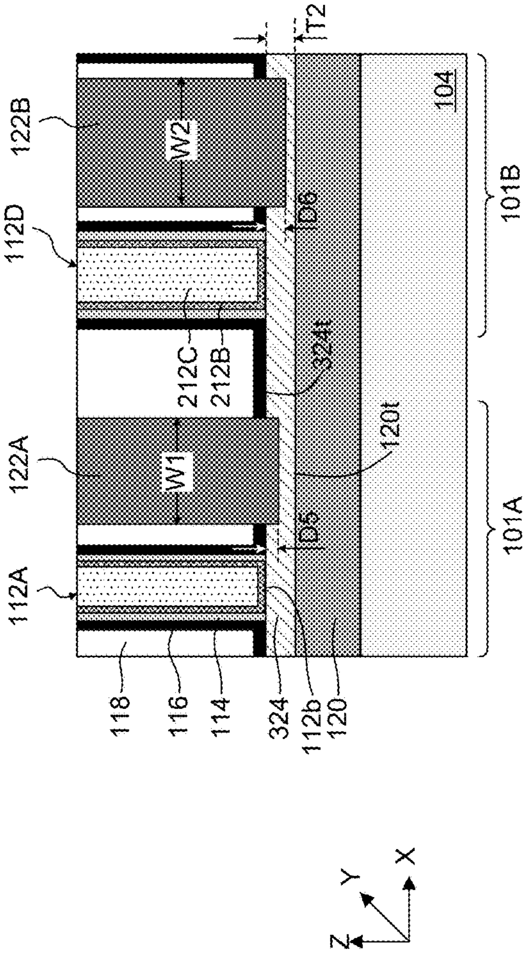
FIGS. 3A-3C illustrate cross-sectional views of another semiconductor device with isolation structures, in accordance with some embodiments.
Figure 3B:
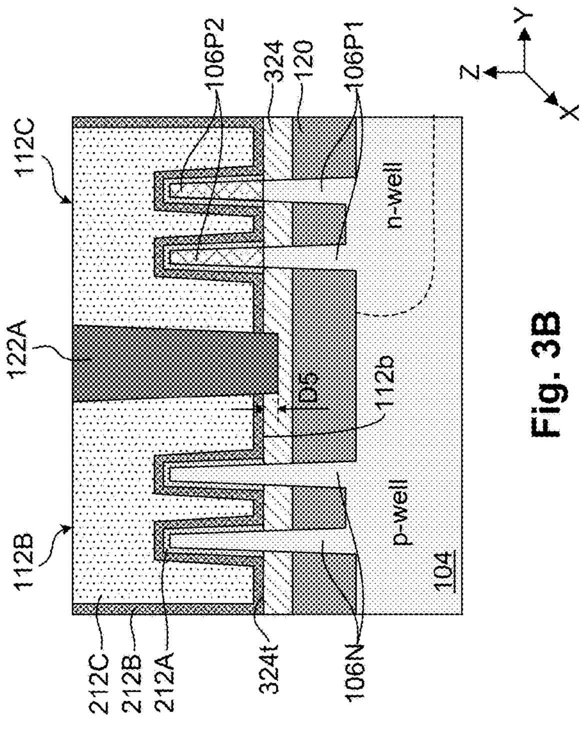
Figure 3C:
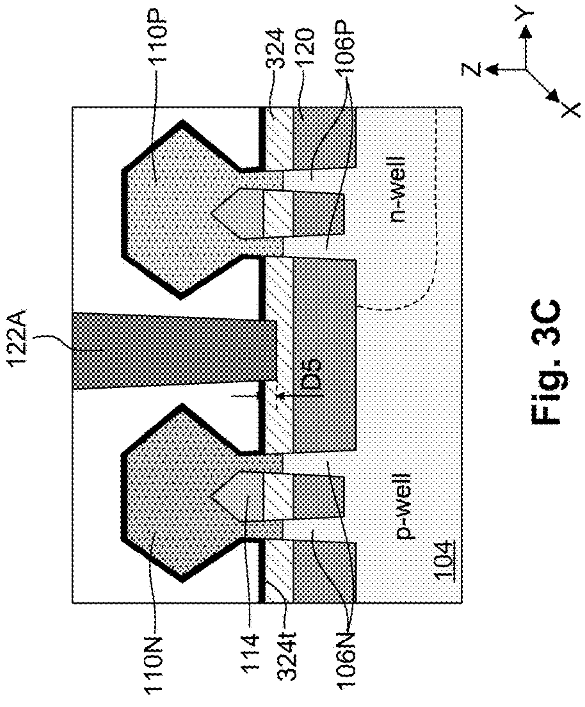
Figure 4A:
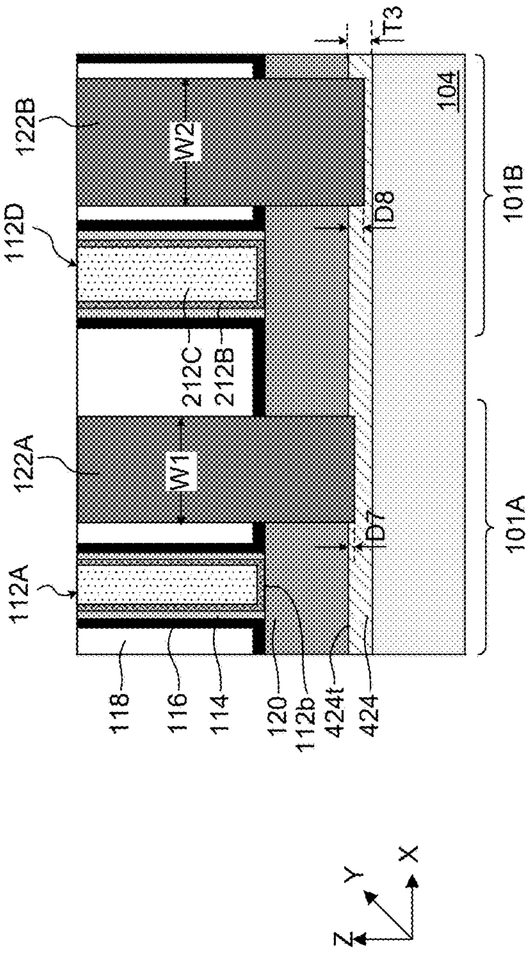
FIGS. 4A-4C illustrate cross-sectional views of another semiconductor device with isolation structures, in accordance with some embodiments.
Figure 4C:
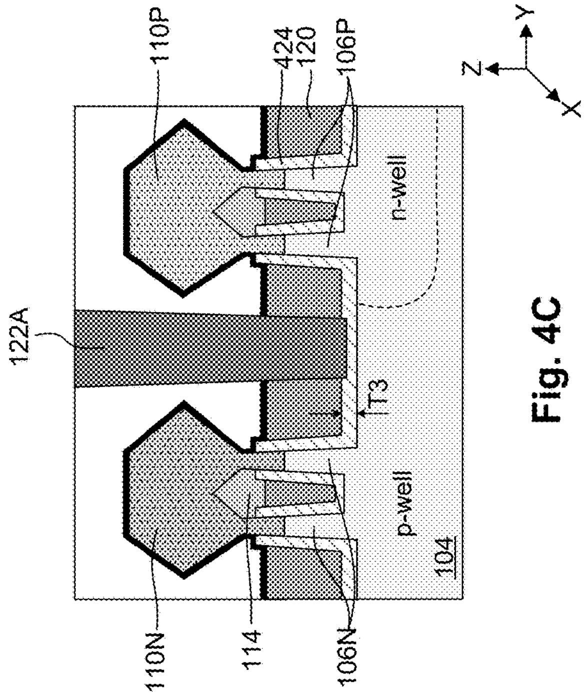
Figure 4B:
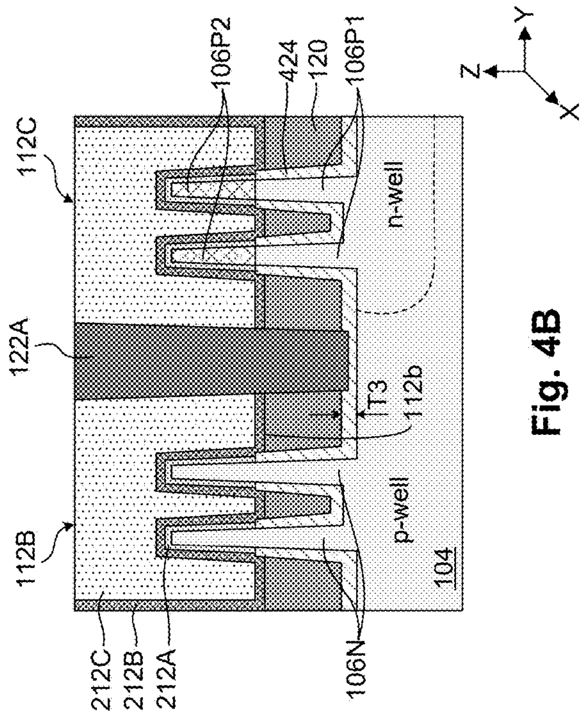

A semiconductor device 100 with NFETs 102N and PFETs 102P in a memory device area 101A and a logic device area 101B is described with reference to FIGS. 1A, 1B, 2A-2C, 3A-3C, and 4A-4C, according to some embodiments. FIG. 1A illustrates an isometric view of semiconductor device 100, according to some embodiments. FIG. 1B illustrates a top-down view of semiconductor device 100, according to some embodiments. FIGS. 2A, 3A, and 4A illustrate different cross-sectional views of semiconductor device 100 along line A-A of FIGS. 1A and 1B. FIGS. 2B, 3B, and 4B illustrate different cross-sectional views of semiconductor device 100 along line B-B of FIGS. 1A and 1B. FIGS. 2C, 3C, and 4C illustrate different cross-sectional views of semiconductor device 100 along line C-C of FIGS. 1A and 1B. FIGS. 2A-2C, 3A-3C, and 4A-4C illustrate cross-sectional views of semiconductor device 100 with additional structures that are not shown in FIGS. 1A and 1B for simplicity. The discussion of elements in FIGS. 1A, 1B, 2A-2C, 3A-3C, and 4A-4C with the same annotations applies to each other, unless mentioned otherwise.

Referring to FIGS. 1A, 1B, and 2A-2C, semiconductor device 100 can include (i) a substrate 104, (ii) fin structures 106N and 106P (not visible in FIGS. 1B and 2A) disposed on substrate 104, (iii) source/drain (S/D) regions 110N and 110P (not visible in FIGS. 2A and 2B) disposed on fin structures 106N and 106P, respectively, (iv) gate structure 112A (not visible in FIGS. 2B and 2C) disposed on fin structures 106N and 106P, (v) gate structure 112B (not visible in FIGS. 2A and 2C) disposed on fin structures 106N, (vi) gate structure 112C (not visible in FIGS. 2A and 2C) disposed on fin structures 106P, (vii) gate structure 112D (not visible in FIGS. 2B and 2C) disposed on fin structures 106N and 106P, (viii) gate structure 112E (not visible in FIGS. 2A-2C) disposed on fin structures 106N, (ix) gate structure 112F (not visible in FIGS. 2A-2C) disposed on fin structures 106P, (x) gate spacers 114 disposed on gate structures 112A-112F, (xi) ESLs 116 (not shown in FIG. 1B and not visible in FIG. 2B) disposed on S/D regions 110N and 110P, (xii) ILD layers 118 (not shown in FIG. 1B and not visible in FIG. 2B) disposed on ESLs 116, (xiii) STI region 120 (not shown in FIG. 1B) disposed on substrate 104, (xiv) isolation structure 122A disposed between gate structures 112B and 112C, (xv) isolation structure 122B (not visible in FIGS. 2B and 2C) disposed between gate structures 112D and 112E, and (xvi) etch control layer 224 (not shown in FIGS. 1A and 1B) disposed directly on STI regions 120.

The discussion of gate structures 112A-112F applies to each other, unless mentioned otherwise. S/D regions 110N and 110P may refer to a source or a drain, individually or collectively dependent upon the context. In some embodiments, fin structures 106N along with elements and portions of elements of semiconductor device 100 disposed on fin structures 106N can form NFETs 102N. Similarly, in some embodiments, fin structures 106P along with elements and portions of elements of semiconductor device 100 disposed on fin structures 106P can form PFETs 102P. In some embodiments, NFETs 102N and PFETs 102P in memory device area 101A can be memory devices or part of a memory device. In some embodiments, NFETs 102N and PFETs 102P in logic device area 101B can be logic devices or part of a logic device. In some embodiments, semiconductor device 100 can further include an isolation structure 109 (shown in FIG. 1A) extending along an X-axis and into substrate 104 to cut fin structures 106N and 106P and to electrically isolate the portions of fin structures 106N and 106P in memory device area 101A from those in logic device area 101B. Isolation structure 109 can include a dielectric material, such as silicon oxide ($SiO_2$) and SiN.

In some embodiments, substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic).

In some embodiments, fin structures 106N can include a material similar to substrate 104. In some embodiments, each of fin structures 106P can include a fin base 106P1 and a fin top 106P2. In some embodiments, fin base 106P1 can include a material similar to substrate 104 and fin top 106P2 can include SiGe. Fin structures 106N and 106P can have elongated sides extending along an X-axis.

In some embodiments, S/D regions 110N can include an epitaxially-grown semiconductor material, such as Si, and n-type dopants, such as phosphorus and other suitable n-type dopants. In some embodiments, S/D regions 110P can include an epitaxially-grown semiconductor material, such as Si and SiGe, and p-type dopants, such as boron and other suitable p-type dopants.

In some embodiments, each of gate structures 112A-112F can include (i) an interfacial oxide (IL) layer 212A, (ii) a high-k gate dielectric layer 212B disposed directly on IL layer 212A, and (iii) a conductive layer 212C disposed directly on high-k gate dielectric layer 212B. In some embodiments, IL layer 212A can include $SiO_2$, silicon germanium oxide ($SiGeO_x$), or germanium oxide ($GeO_x$). IL layers 212A of gate structures 112A and 112D can be disposed directly on both fin structures 106N and 106P. IL layers 212A of gate structures 112B and 112E can be disposed directly on fin structures 106N, and IL layers 212A of gate structures 112C and 112F can be disposed directly on fin structures 106P.

In some embodiments, high-k gate dielectric layer 212B can include a high-k dielectric material, such as hafnium oxide (HfO2), titanium oxide (TiO2), hafnium zirconium oxide (HfZrO), tantalum oxide (Ta2O3), hafnium silicate (HfSiO4), zirconium oxide (ZrO2), zirconium aluminum oxide (ZrAlO), zirconium silicate (ZrSiO2), lanthanum oxide (La2O3), aluminum oxide (Al2O3), zinc oxide (ZnO), hafnium zinc oxide (HfZnO), and yttrium oxide (Y2O3). In some embodiments, conductive layer 212C can be multi-layered structures. The different layers of conductive layer 212C are not shown for simplicity. In some embodiments, conductive layer 212C can include a work function metal (WFM) layer disposed on high-k gate dielectric layer 212B and a gate metal fill layer disposed on the WFM layer. In some embodiments, the WFM layer can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu). In some embodiments, the WFM layer can include titanium aluminum (TiAl), titanium aluminum carbide (TiAlC), tantalum aluminum (TaAl), tantalum aluminum carbide (TaAlC), Al-doped Ti, Al-doped TIN, Al-doped Ta, Al-doped TaN, or other suitable Al-based materials. In some embodiments, the gate metal fill layer can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), metal alloys, and a combination thereof.

In some embodiments, gate structures 112A, 112B, and 112C in memory device area 101A can have a gate pitch GP1 and gate lengths GL1. In some embodiments, gate structures 112D, 112E, and 112F in logic device area 101B can have a gate pitch GP2 and gate lengths GL2. In some embodiments, gate pitch GP1 and gate lengths GL1 can be smaller than gate pitch GP2 and gate lengths GL2, respectively. As a result, memory device area 101A can have a higher density device area with a larger number of gate structures and a larger number of finFETs per unit device area compared to logic device area 101B. The gate pitch is defined as a sum of a distance along an X-axis between adjacent gate structures with equal gate lengths and a gate length (e.g., GL1-GL2 shown in FIG. 1A) of one of the adjacent gate structures. Gate structures 112A-112F can be electrically isolated from each other by gate spacers 114, ESLs 116, and ILD layers 118. In some embodiments, gate spacers 114, ESLs 116, and ILD layers 118 can include an insulating material, such as $SiO_2$, SiN, silicon oxynitride (SiON), silicon oxycarbide (SiOC), silicon carbon nitride (SiCN), silicon oxycarbon nitride (SiOCN), and $SiGeO_x$.

In some embodiments, STI regions 120 can electrically isolation fin structures 106N and 106P from each other. In some embodiments, STI regions 120 can include an insulating material, such as $SiO_2$, SiN, SION, SiOC, SiCN, and SiOCN. In some embodiments, portions of gate structures 112A-112F that are not disposed directly on fin structures 106N or 106P can be disposed on STI regions 120.

In some embodiments, in addition to gate spacers 114, ESLs 116, and ILD layers 118, gate structures 112B and 112C can be electrically isolated from each other by isolation structure 122A and gate structures 112E and 112F can be electrically isolated from each other by isolation structure 122B to provide independently-controlled gate structures. Isolation structures 122A and 122B can be formed at the same time with dielectric constants different from each other in a CMG process (described in detail below) to cut long gate structures (e.g., along a Y-axis) into shorter gate structures, such as gate structures 112B, 112C, 112E, and 112F. In some embodiments, isolation structures 122A and 122B can include an insulating material, such as SiO2, SiN, SiON, SiOC, SiCN, and SiOCN.

In some embodiments, isolation structure 122A in memory device area 101A can have a width W1 smaller than a width W2 of isolation structure 122B in logic device area 101B. The width W1 can be smaller than width W2 since gate lengths GL1 in memory device area 101A is smaller than gate lengths GL2 in logic device area 101B. The widths W1 and W2 correspond to gate lengths GL1 and GL2 because isolation structures 122A and 122B are formed by removing redundant gate portions between gate structures 112B and 112C and between gate structures 112E and 112F, as described in detail below. In some embodiments, width W1 can be about 20 nm to about 30 nm and width W2 can be about 30 nm to about 40 nm. In some embodiments, isolation structures 122A and 122B can have rectangular cross-sectional profiles (shown in FIG. 2A) along an XZ-plane and can have trapezoidal cross-sectional profiles (shown in FIGS. 2B and 2C) along a YZ-plane. In some embodiments, isolation structures 122A and 122B can have vertical sidewalls (shown in FIG. 2A) along a YZ-plane and can have sloped sidewalls (shown in FIGS. 2B and 2C) along an XZ-plane.

In some embodiments, bottom surfaces 122As and 122Bs of isolation structures 122A and 122B can have a substantially planar cross-sectional profile, which can be due to the etching profile control by etch control layer, such as etch control layers 224, 324, and 424 during the formation of isolation structures 122A and 122B in a CMG process, as described in detail below. In some embodiments, the depth profiles of isolation structures 122A and 122B can depend on the position and/or thickness of etch control layers, such as etch control layers 224, 324, and 424 in semiconductor device 100, as described in detail below with reference to FIGS. 2A-2C, 3A-3C, and 4A-4C. The following discussion of etch control layers 224, 324, 424 applies to each other, unless mentioned otherwise.

Referring to FIGS. 2A-2C, in some embodiments, etch control layer 224 can be configured to prevent isolation structures 122A and 122B from extending into substrate 104, thus preventing the formation of current leakage path between NFETs 102N and PFETs 102P through substrate 104. In some embodiments, etch control layer 224 can be disposed (i) directly on STI regions 120, (ii) directly under the portions of gate structures 112A-112F that are not disposed directly on fin structures 106N or 106P, (iii) surrounding portions of fin structures 106N and 106P that are under gate structures 112A-112F, and (iv) directly under the portions of ESLs 116 that are not disposed directly on S/D regions 110N and 110P and on gate structures 112A-112F. Etch control layer 224 can be used to control the distance to which the portions of isolation structures 122A and 122B can extend below bottom surfaces 112$b$ of gate structures 112A-112F. In some embodiments, etch control layer 224 with a thickness T1 of about 5 nm to about 20 nm can adequately control the depth profile of (i) isolation structure 122A to extend a distance D1 below top surfaces 120*t* of STI regions 120 and maintain a distance D2 of at least about 10 nm (e.g., about 10 nm to about 50 nm) between bottom surface 122As and a top surface 104*t* of substrate 104, and (ii) isolation structure 122B to extend a distance D3 below top surfaces 120*t* of STI regions 120 and maintain a distance D4 of at least about 10 nm (e.g., about 10 nm to about 50 nm) between bottom surface 122Bs and top surface 104*t* of substrate 104. In some embodiments, distance D3 can be greater than distance D1. Preventing isolation structures 122A and 122B from extending into substrate 104 and maintaining distances D2 and D4 can prevent charged carriers from being induced into substrate 104, thus preventing the formation of current leakage path between NFETs 102N and PFETs 102P through substrate 104.

Referring to FIGS. 3A-3C, in some embodiments, instead of etch control layer 224, etch control layer 324 can be used to prevent isolation structures 122A and 122B from extending into substrate 104. In some embodiments, etch control layer 324 with a thickness T2 of about 20 nm to about 50 nm can adequately control the depth profile of (i) isolation structure 122A to extend a distance D5 below top surface 324*t* of etch control layer 324, and (ii) isolation structure 122B to extend a distance D6 below top surface 324*t* of etch control layer 324. In some embodiments, distance D6 can be greater than distance D5. In some embodiments, etch control layer 324 can be used to control the depth profile of isolation structures 122A and 122B so that bottom surfaces 122As and 122Bs of isolation structures 122A and 122B can be disposed directly on top surfaces 120*t* of STI regions (not shown). Thus, with the use of thicker etch control layer 324 compared to etch control layer 224, the portions of isolation structures 122A and 122B below bottom surfaces 112*b* of gate structures 112A-112F can be limited within etch control layer 324 and may not extend into STI regions.

Referring to FIGS. 4A-4C, in some embodiments, instead of etch control layer 224 or 324, etch control layer 424 can be used to prevent isolation structures 122A and 122B from extending into substrate 104. In some embodiments, etch control layer 424 can be disposed (i) directly on substrate 104, (ii) directly under STI regions 120, (iii) directly on sidewalls of fin structures 106N and 106P that are not covered by S/D regions 110N and 110P and gate structures 112A-112F, and (iv) directly on sidewalls of S/D regions 110N and 110P that are not covered by ESLs 116. In some embodiments, etch control layer 424 with a thickness T3 of about 5 nm to about 50 nm can adequately control the depth profile of (i) isolation structure 122A to extend a distance D7 below top surface 424*t* of etch control layer 424 and (ii) isolation structure 122B to extend a distance D8 below top surface 424*t* of etch control layer 424. In some embodiments, distance D8 can be greater than distance D7. In some embodiments, etch control layer 424 can be used to control the depth profile of isolation structures 122A and 122B so that bottom surfaces 122As and 122Bs of isolation structures 122A and 122B can be disposed directly on top surface 424*t* of etch control layer 424 (not shown).

Figure 5:
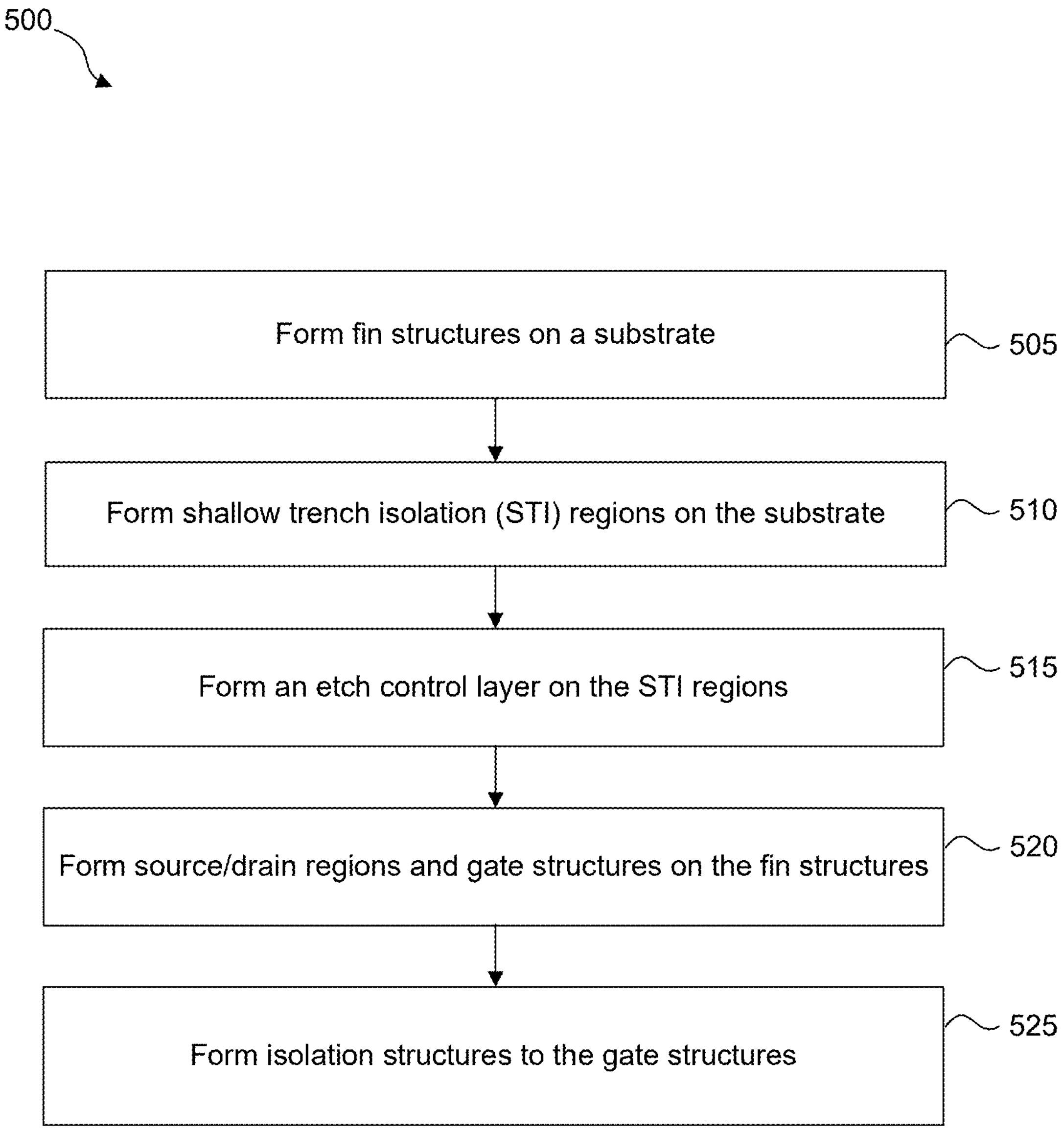
FIG. 5 is a flow diagram of a method for fabricating a semiconductor device with isolation structures, in accordance with some embodiments.

FIG. 5 is a flow diagram of an example method 500 for fabricating semiconductor device 100 with cross-sectional views shown in FIGS. 2A-2C, according to some embodiments. For illustrative purposes, the operations illustrated in FIG. 5 will be described with reference to the example fabrication process for fabricating semiconductor device 100 as illustrated in FIGS. 6-11, 12A-12C, 13A-13C, and 14A-14C. FIGS. 6-11 are cross-sectional views of semiconductor device 100 along line B-B of FIGS. 1A and 1B at various stages of fabrication, according to some embodiments. FIGS. 12A-14A are cross-sectional views of semiconductor device 100 along line A-A of FIGS. 1A and 1B at various stages of fabrication, according to some embodiments. FIGS. 12B-14B are cross-sectional views of semiconductor device 100 along line B-B of FIGS. 1A and 1B at various stages of fabrication, according to some embodiments. FIGS. 12C-14C are cross-sectional views of semiconductor device 100 along line C-C of FIGS. 1A and 1B at various stages of fabrication, according to some embodiments. Operations can be performed in a different order or not performed depending on specific applications. It should be noted that method 500 may not produce a complete semiconductor device 100. Accordingly, it is understood that additional processes can be provided before, during, and after method 500, and that some other processes may only be briefly described herein. The discussion of elements in FIGS. 1A, 1B, 2A-2C, 6-11, 12A-12C, 13A-13C, and 14A-14C with the same annotations applies to each other, unless mentioned otherwise.

Figure 6:
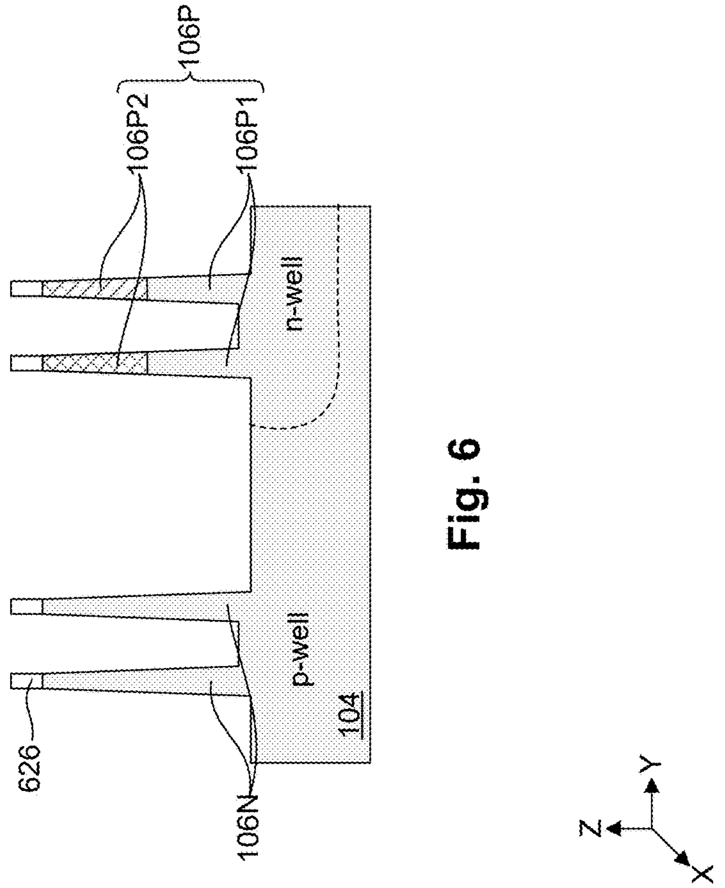
Figure 9:
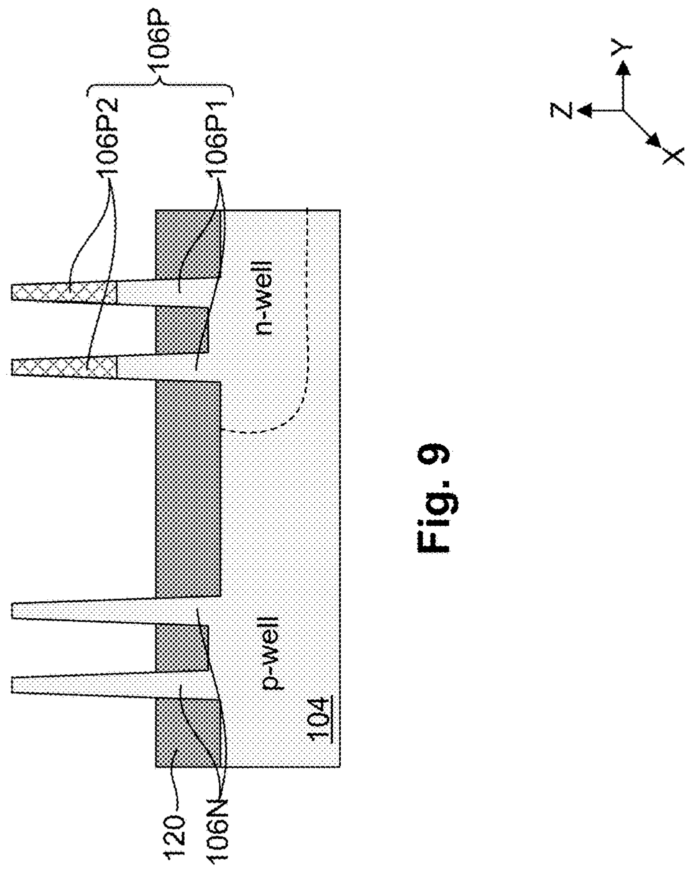

Referring to FIG. 5, in operation 505, fin structures are formed on a substrate. For example, as shown in FIG. 6, fin structures 106N and 106P are formed on substrate 104. In some embodiments, fin structure 106N can be formed by etching substrate 104. In some embodiments, fin structures 106P can be formed by (i) etching (not shown) a portion of substrate 104 on n-well, (ii) depositing a SiGe layer (not shown) on the etched portion of substrate 104, and (iii) etching the SiGe layer and substrate 104 to form fin structures 106P, as shown in FIG. 6. In some embodiments, hard mask layers 626 can be formed on fin structures 106N and 106P.

Figure 7:
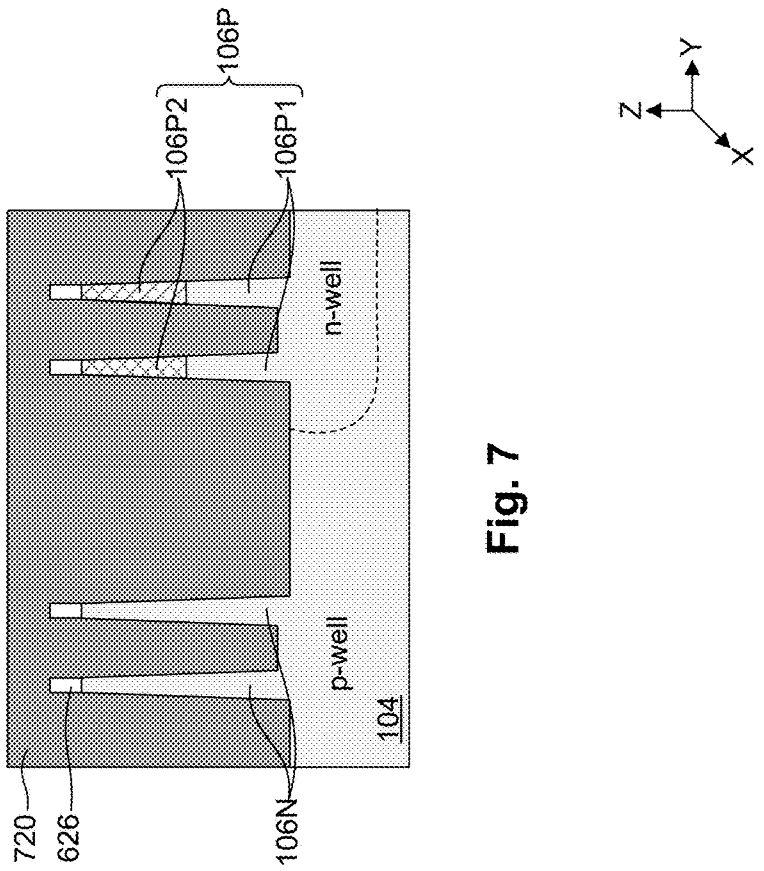
Figure 8:
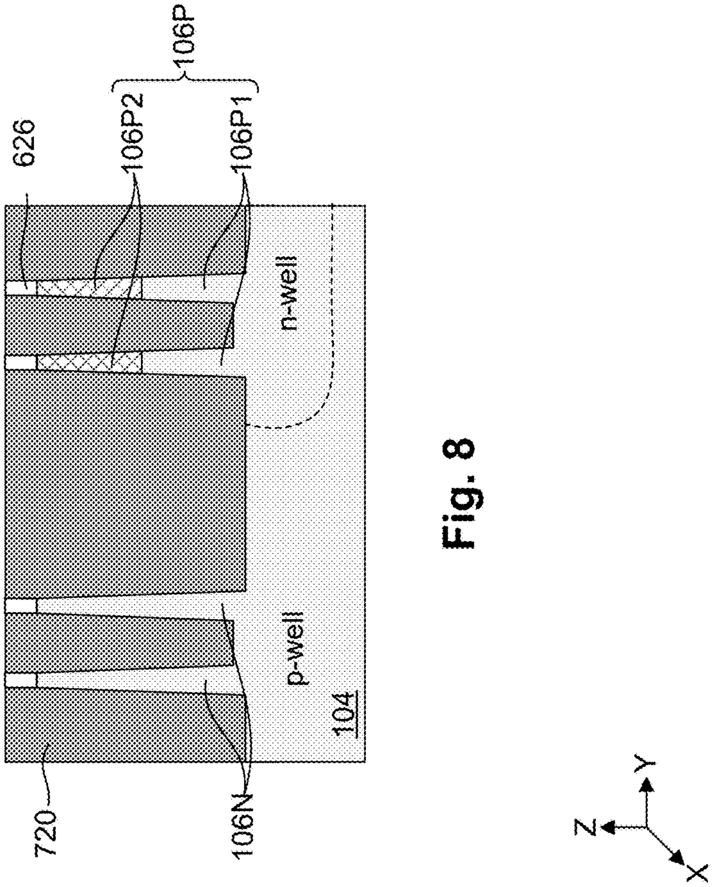
Figure 11:
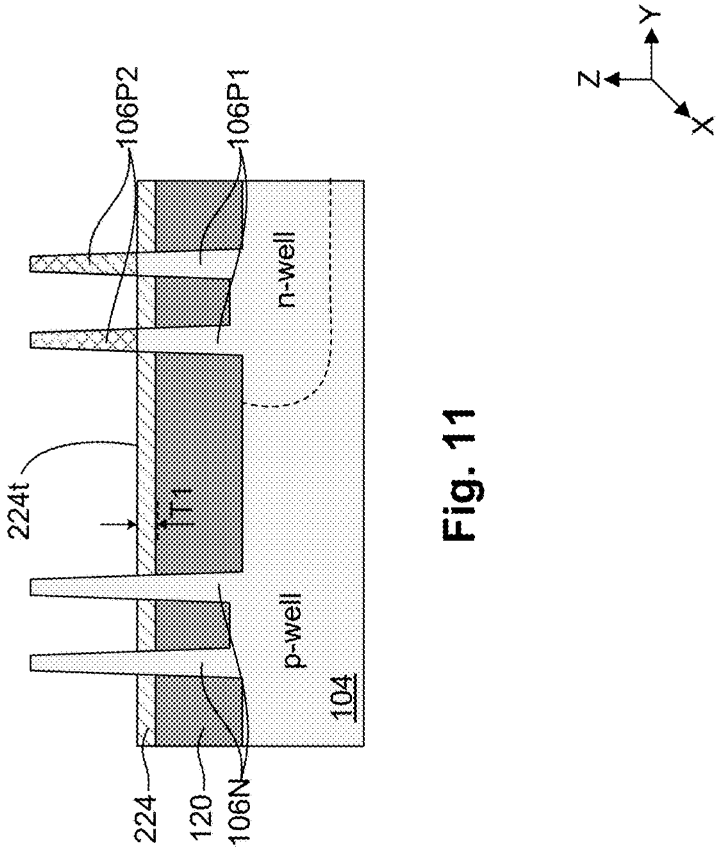

Referring to FIG. 5, in operation 510, STI regions are formed on the substrate. For example, as described with reference to FIGS. 7-9, STI regions 120 are formed on substrate 104. In some embodiments, the formation of STI regions 120 can include sequential operations of (i) depositing a dielectric layer 720 on the structure of FIG. 6, as shown in FIG. 7, (ii) performing a chemical mechanical polishing (CMP) process to coplanarize top surfaces of dielectric layer 720 and hard mask layers 626, as shown in FIG. 8, (iii) removing hard mask layers 626 (not shown), and (iv) performing an etch process on dielectric layer 720 to form the structure of FIG. 9.

Figure 10:
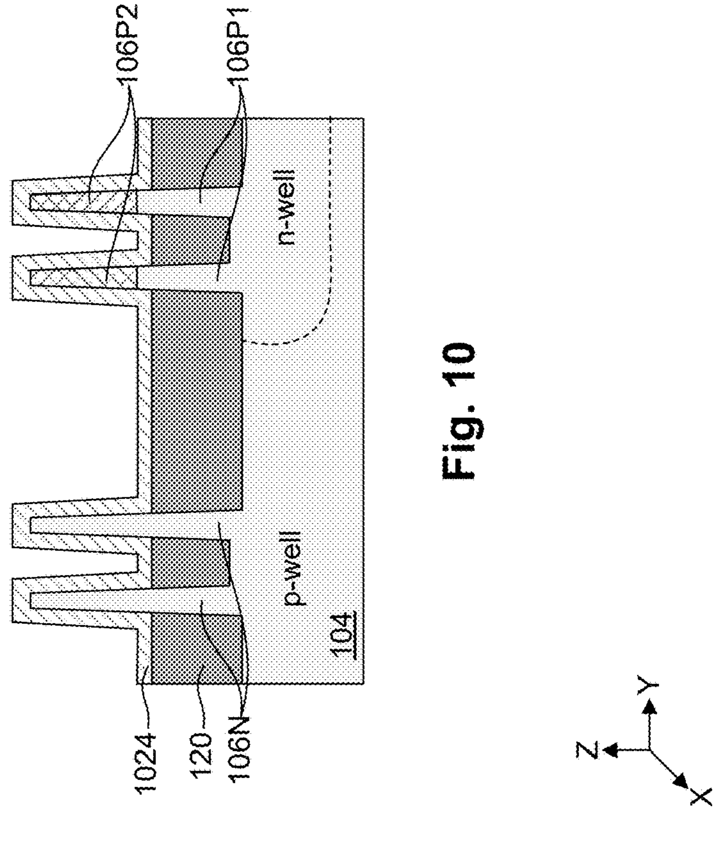

Referring to FIG. 5, in operation 515, an etch control layer is formed on the STI regions. For example, as described with reference to FIGS. 10 and 11, etch control layer 224 is formed on STI regions 120. In some embodiments, the formation of etch control layer 224 can include sequential operations of (i) depositing a dielectric layer 1024 having the material of etch control layer 224 on the structure of FIG. 9, as shown in FIG. 10, and (ii) performing an etch process on dielectric layer 1024 to form the structure of FIG. 11. In some embodiments, top surface 224*t* of etch control layer 224 can be substantially coplanar with top surfaces of fin bases 106P1. In some embodiments, the formation of etch control layer 224 can be followed by the formation of sacrificial polysilicon structures (not shown) on the portions of fin structures 106N and 106P extending above top surface 224*t* of etch control layer 224 and directly on etch control layer 224.

Referring to FIG. 5, in operation 520, S/D regions and gate structures are formed on the fin structures. For example, as described with reference to FIGS. 12A-12C, S/D regions 110N and 110P and gate structures 112A, 112BC, 112D, and 112EF are formed on fin structures 106N and 106P. S/D regions 110N and 110P are not visible in FIGS. 12A and 12B. Gate structures 112A, 112D, and 112EF are not visible in FIGS. 12B and 12C. Gate structure 112BC is not visible in FIG. 12C.

In some embodiments, S/D regions 110N and 110P can be formed on portions of fin structures 106N and 106P that are not covered by the sacrificial polysilicon structures. The formation of S/D regions 110N and 110P can be followed by the formation of ESLs 116 and ILD layers 118, which can be followed by the replacement of the sacrificial polysilicon structures with gate structures 112A, 112BC, 112D, and 112EF directly on etch control layer 224, as shown in FIGS. 12A and 12B.

Figure 12A:
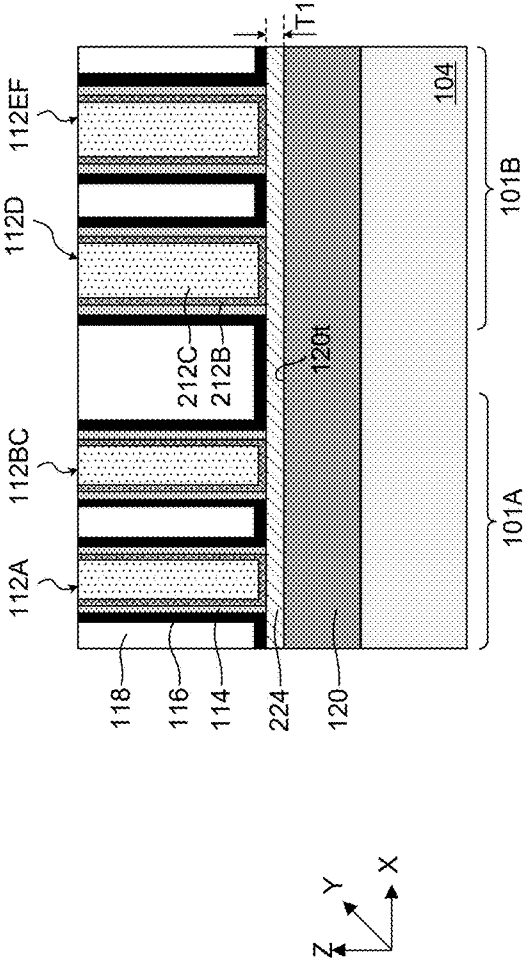
Figure 12B:
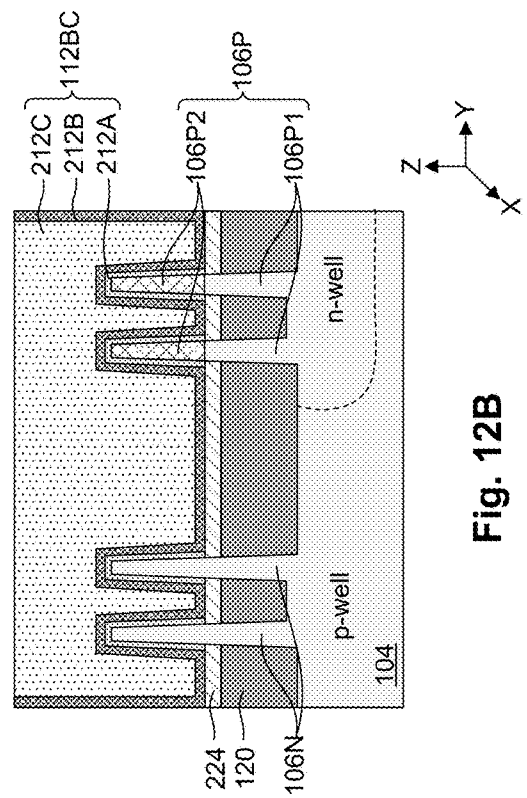
Figure 12C:
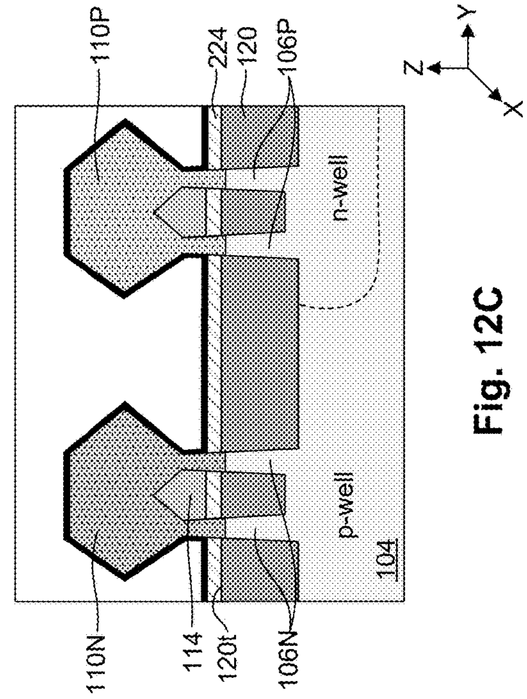

The formation of gate structures 112A, 112BC, 112D, and 112EF can include sequential operations of (i) removing the sacrificial polysilicon structures (not shown), (ii) forming IL layers 212A by performing an oxidation process on the portions of fin structures 106N and 10P extending above top surface 224*t* of etch control layer 224 after the formation of S/D regions 110N and 110P, as shown in FIG. 12B, (iii) depositing high-k dielectric layer 212B directly on IL layers 212A and etch control layer 224, as shown in FIGS. 12A and 12B, (iv) depositing conductive layer 212C on high-k dielectric layer 212B, as shown in FIGS. 12A and 12B, and (v) performing a CMP process on high-k dielectric layer 212B and conductive layer 212C to substantially coplanarize top surfaces of ESLs 116, IL layer 212A, high-k dielectric layer 212B, and conductive layer 212C with each other, as shown in FIGS. 12A and 12B.

Figure 13A:
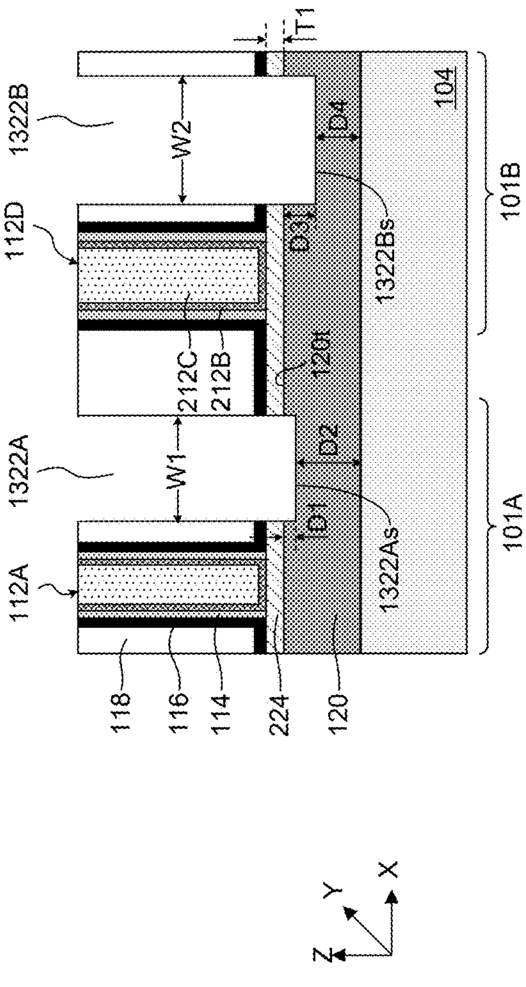
Figure 13B:
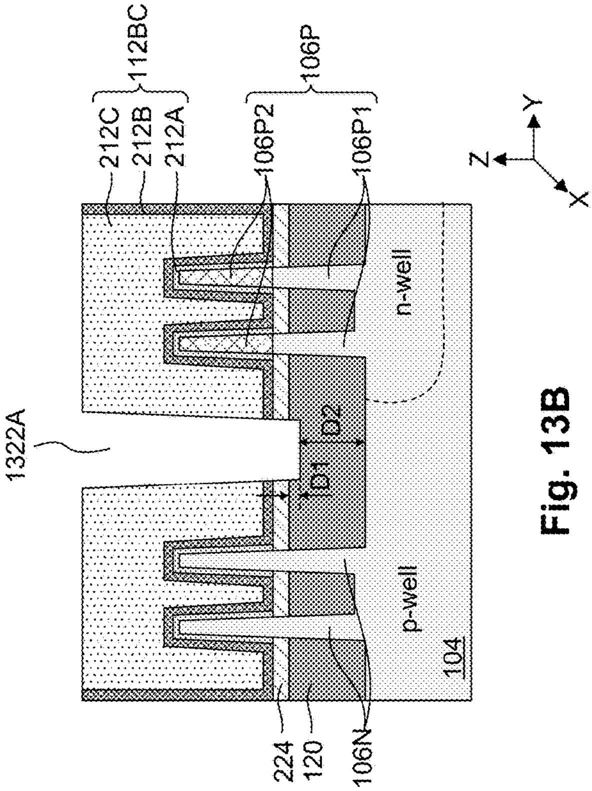
Figure 13C:
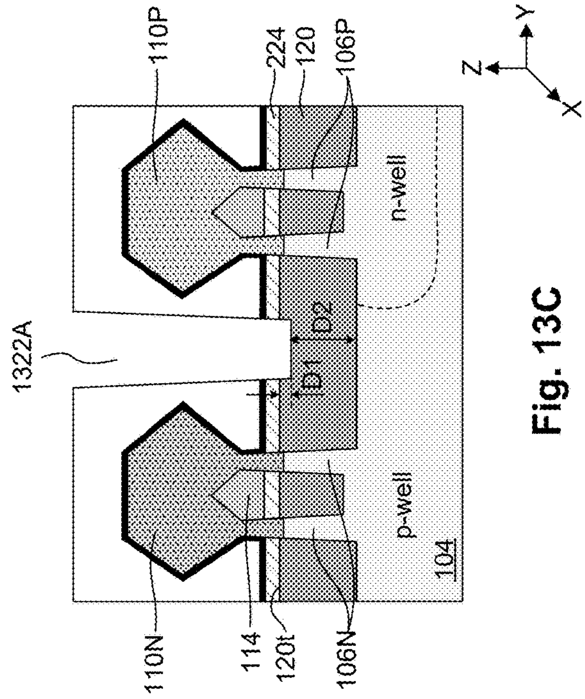
Figure 14A:
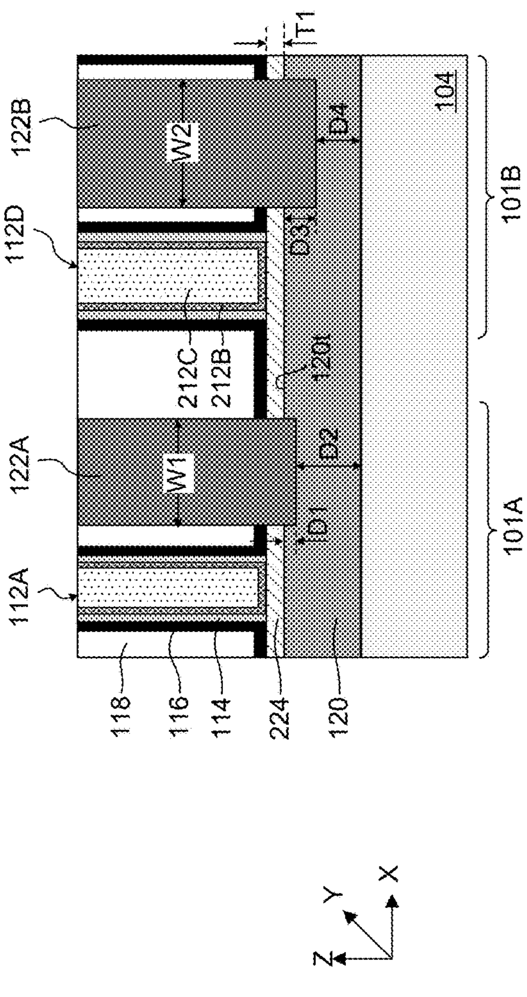
Figure 14B:
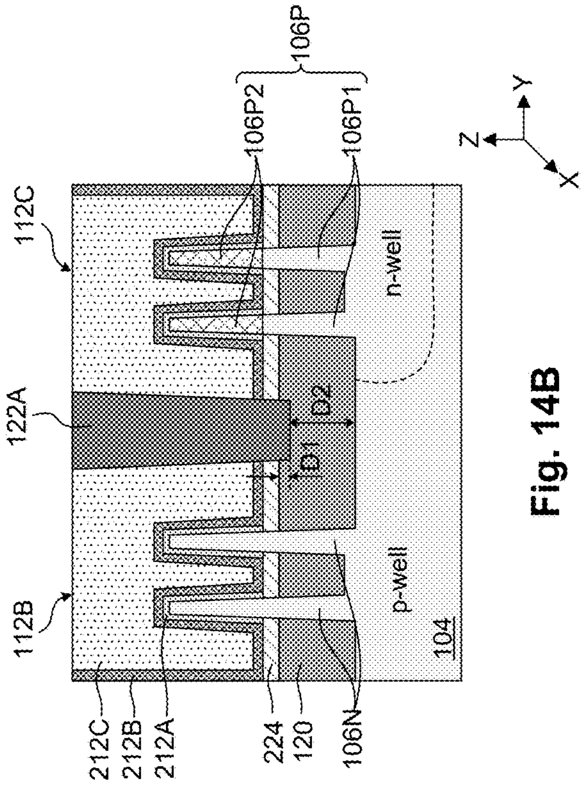
Figure 14C:
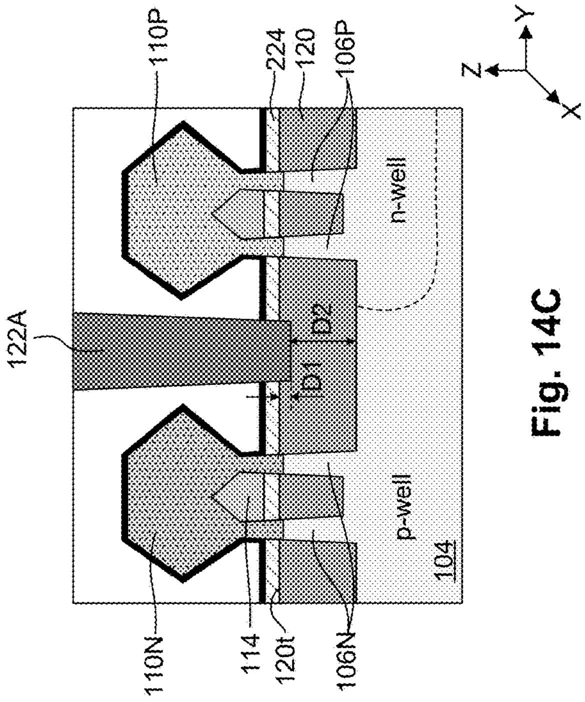

Referring to FIG. 5, in operation 525, isolation structures are formed to cut the gate structures and the fin structures. For example, as described with reference to FIGS. 13A-13C and 14A-14C, isolation structure 122A is formed to cut gate structure 112BC into gate structures 112B and 112C and isolation structure 122B is formed to cut gate structure 112EF into gate structures 112E and 112F. The process for forming isolation structures 122A and 122B can be referred to as the CMG process discussed above. The formation of isolation structures 122A and 122B can include sequential operations of (i) forming isolation trenches 1322A and 1322B (not visible in FIGS. 13B and 13C), as shown in FIGS. 13A-13C, (ii) depositing a dielectric layer (not shown) having the material of isolation structures 122A and 122B on the structures of FIGS. 13A-13C to fill isolation trenches 1322A and 1322B, and (iii) performing a CMP process on the dielectric layer to substantially coplanarize top surfaces of isolation structures 122A and 122B with top surfaces of ILD layers 118.

The formation of isolation trenches 1322A and 1322B can include performing an etching process to etch redundant gate portions of gate structures 112BC and 112EF between fin structures 106N and 106P and etch redundant dielectric portions, which include portions of gate spacers 114, ESL 116, and ILD layer 118 on the sidewalls of redundant gate portions. The etching process can include a dry etching using an etchant that has a higher etch selectivity for the metallic material of the redundant gate portions than the material of etch control layer 224. Due to the lower etch selectivity of etch control layer 224, the etching rate of the etching process can be significantly reduced after the redundant gate portions are removed and top surfaces 224*t* of etch control layer 224 are exposed in isolation trenches 1322A and 1322B. As a result, the etch depth of isolation trenches 1322A and 1322B can be precisely controlled and prevented from extending into substrate 104. In some embodiments, due to the reduced etching rate at etch control layer 224, substantially planar bottom surfaces 1322As and 1322Bs of isolation trenches 1322A and 1322B can be achieved.

In some embodiments, isolation trench 1322B can extend deeper into STI regions 120 by distance D3 compared to isolation trench 1322A, which can extend into STI regions by distance D1. This difference in the depths of isolation trenches 1322A and 1322B can be due to the higher etching rate of the redundant gate portion of gate structure 112EF than that of the redundant gate portion of gate structure 112BC. The higher etching rate can be due to the wider dimensions of gate structure 112EF along an X-axis than that of gate structure 112BC. The discussion of the cross-sectional profiles and the depth profiles of isolation structures 122A and 122B applies to the cross-sectional profiles and the depth profiles of isolation trenches 1322A and 1322B.

Figure 15:
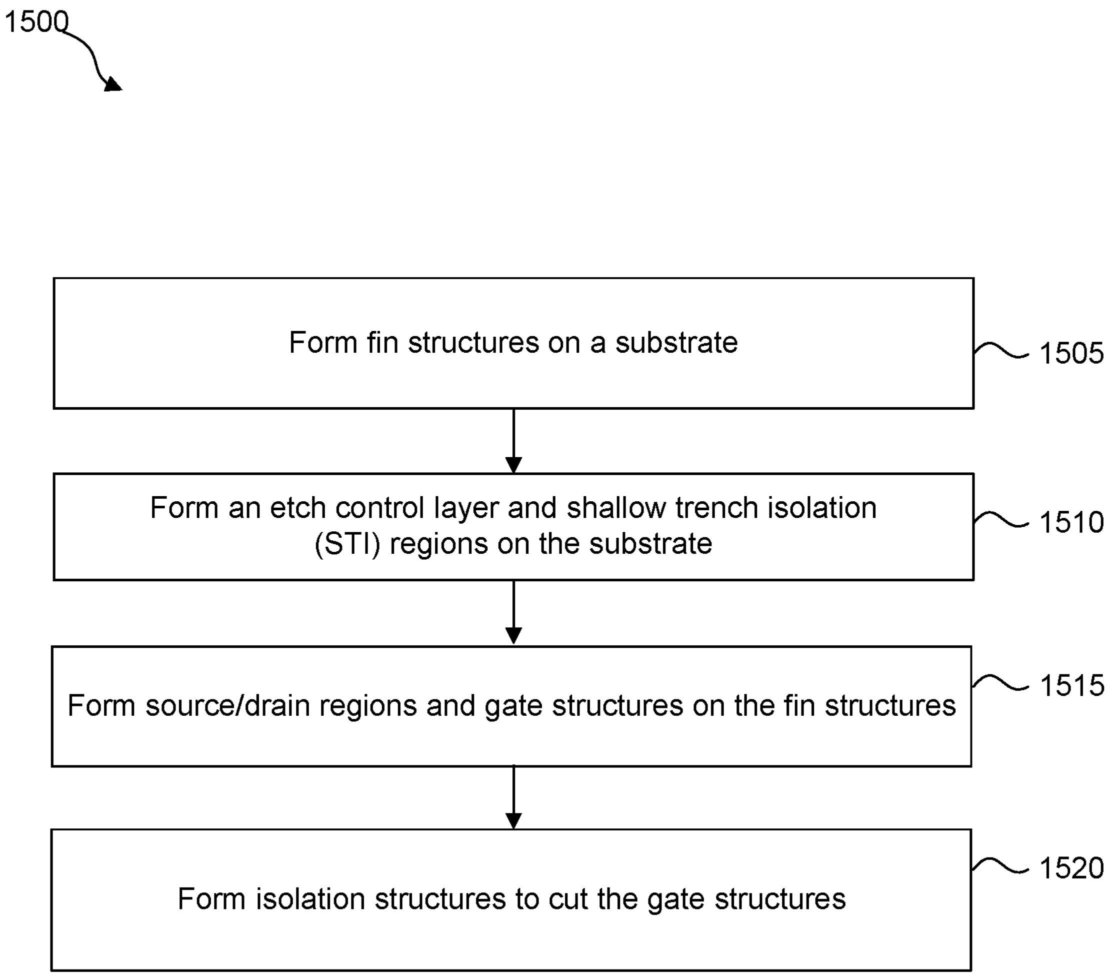
FIG. 15 is a flow diagram of a method for fabricating another semiconductor device with isolation structures, in accordance with some embodiments.

FIG. 15 is a flow diagram of an example method 1500 for fabricating semiconductor device 100 with cross-sectional views shown in FIGS. 4A-4C, according to some embodiments. For illustrative purposes, the operations illustrated in FIG. 15 will be described with reference to the example fabrication process for fabricating semiconductor device 100 as illustrated in FIGS. 16-19, 20A-20C, 21A-21C, and 22A-22C. FIGS. 16-19 are cross-sectional views of semiconductor device 100 along line B-B of FIGS. 1A and 1B at various stages of fabrication, according to some embodiments. FIGS. 20A-22A are cross-sectional views of semiconductor device 100 along line A-A of FIGS. 1A and 1B at various stages of fabrication, according to some embodiments. FIGS. 20B-22B are cross-sectional views of semiconductor device 100 along line B-B of FIGS. 1A and 1B at various stages of fabrication, according to some embodiments. FIGS. 20C-22C are cross-sectional views of semiconductor device 100 along line C-C of FIGS. 1A and 1B at various stages of fabrication, according to some embodiments. Operations can be performed in a different order or not performed depending on specific applications. It should be noted that method 1500 may not produce a complete semiconductor device 100. Accordingly, it is understood that additional processes can be provided before, during, and after method 1500, and that some other processes may only be briefly described herein. The discussion of elements in FIGS. 1A, 1B, 4A-4C, 16-19, 20A-20C, 21A-21C, and 22A-22C with the same annotations applies to each other, unless mentioned otherwise.

Referring to FIG. 15, operation 1505 is similar to operation 505 of FIG. 5. After operation 1505, structure similar to the structure of FIG. 6 is formed. The subsequent processing on the structure of FIG. 6 in operation 1510 is described with reference to FIG. 16.

Figure 17:
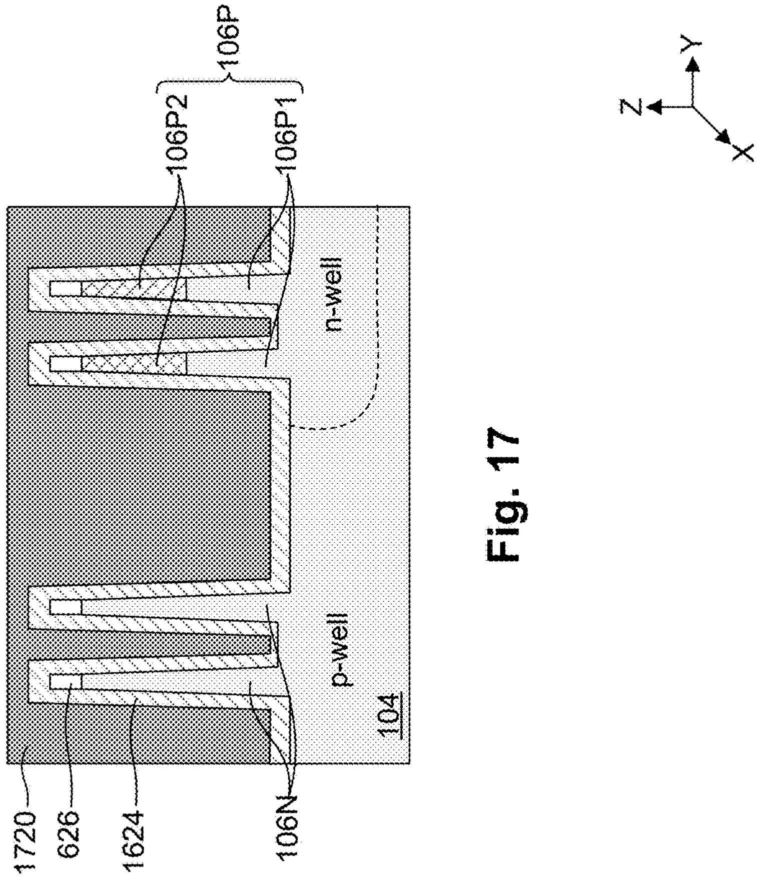
Figure 16:
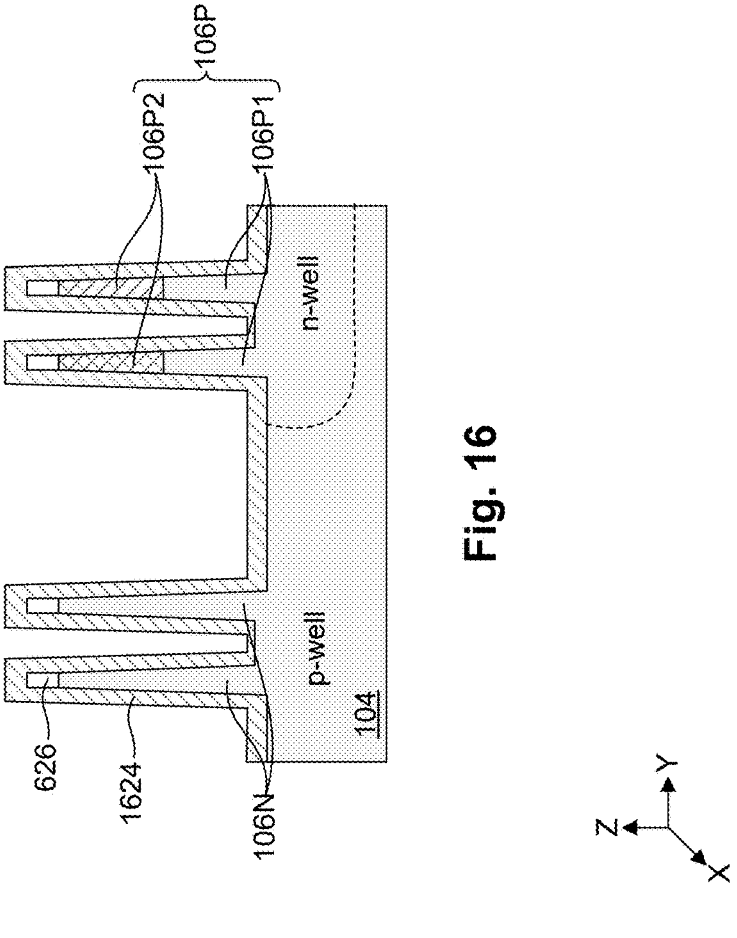
Figure 19:
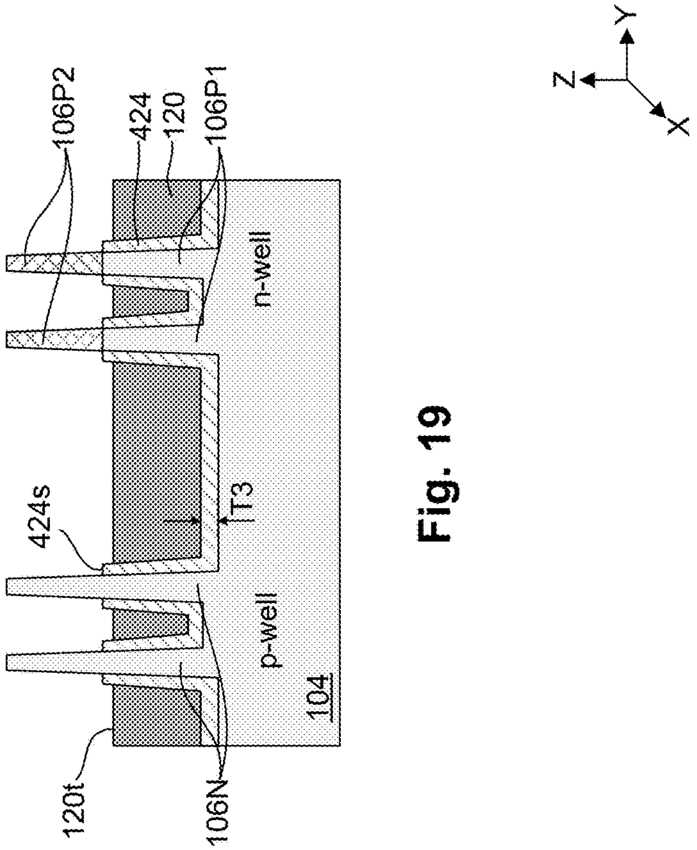
Figure 18:
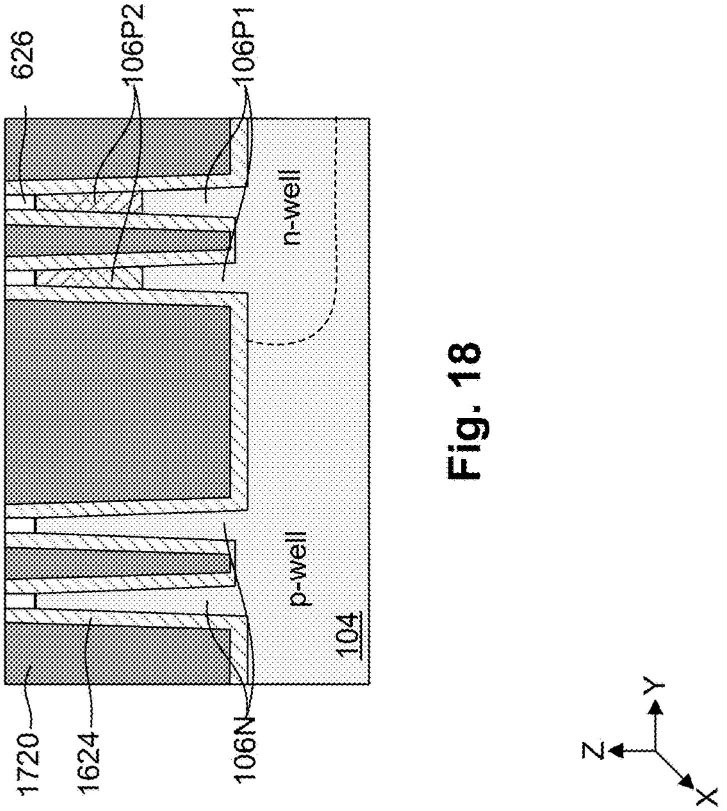

Referring to FIG. 15, in operation 1510, an etch control layer and STI regions are formed on the substrate. For example, as described with reference to FIGS. 17-19, etch control layer 424 is directly formed on substrate 104 and STI regions 120 are formed on etch control layer at the same time. The formation of etch control layer 424 and STI regions 120 can include sequential operations of (i) depositing a dielectric layer 1624 having the material of etch control layer 424 on the structure of FIG. 6, as shown in FIG. 16, (ii) depositing a dielectric layer 1720 having the material of STI regions 120 on the structure of FIG. 16, as shown in FIG. 17, (iii) performing a CMP process to substantially coplanarize top surfaces of dielectric layers 1624 and 1720 with top surfaces of hard mask layers 626, as shown in FIG. 18, (iv) removing hard mask layers 626 (not shown), and (v) performing an etch process on dielectric layers 1624 and 1720 to form the structure of FIG. 19. In some embodiments, top surfaces 424*s* of fin-sidewall portions of etch control layer 424 can extend above top surfaces 120*t* of STI regions 120, as shown in FIG. 19. In some embodiments, top surfaces 424*s* can be substantially coplanar with top surfaces 120*t* of STI regions 120 (not shown). In some embodiments, the formation of etch control layer 424 can be followed by the formation of sacrificial polysilicon structures (not shown) on the portions of fin structures 106N and 106P extending above top surfaces 424*s* of etch control layer 424 and directly on STI regions 120.

Referring to FIG. 15, in operation 1520, S/D regions and gate structures are formed on the fin structures. For example, as described with reference to FIGS. 20A-20C, S/D regions 110N and 110P and gate structures 112A, 112BC, 112D, and 112EF are formed on fin structures 106N and 106P. S/D regions 110N and 110P are not visible in FIGS. 20A and 20B. Gate structures 112A, 112D, and 112EF are not visible in FIGS. 20B and 20C. Gate structure 112BC is not visible in FIG. 20C.

In some embodiments, S/D regions 110N and 110P can be formed on portions of fin structures 106N and 106P that are not covered by the sacrificial polysilicon structures. The formation of S/D regions 110N and 110P can be followed by the formation of ESLs 116 and ILD layers 118, which can be followed by the replacement of the sacrificial polysilicon structures with gate structures 112A, 112BC, 112D, and 112EF directly on STI regions 120 and on top surfaces 424*s*, as shown in FIGS. 20A and 20B.

Figure 20A:
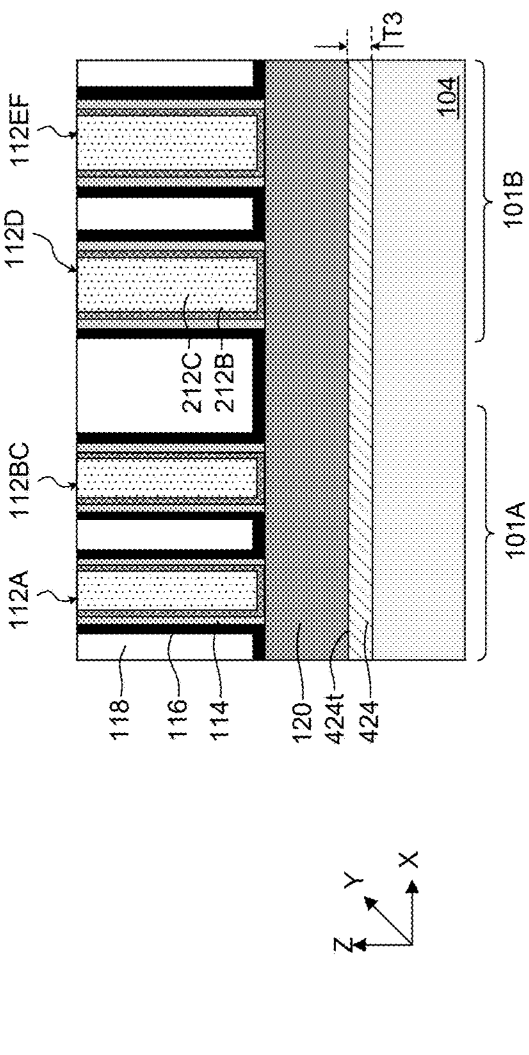
Figure 20B:
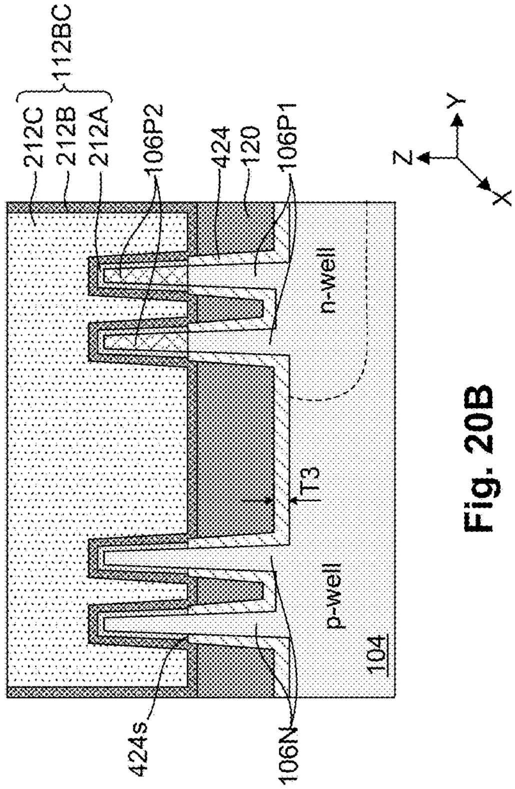
Figure 20C:
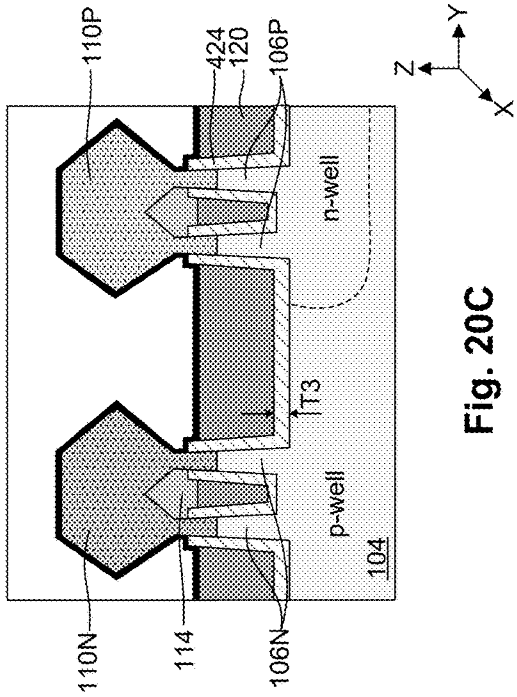

The formation of gate structures 112A, 112BC, 112D, and 112EF can include sequential operations of (i) removing the sacrificial polysilicon structures (not shown), (ii) forming IL layers 212A by performing an oxidation process on the portions of fin structures 106N and 106P extending above top surface 424*s* of etch control layer 424 after the formation of S/D regions 110N and 110P, as shown in FIG. 20B, (iii) depositing high-k dielectric layer 212B directly on IL layers 212A, as shown in FIGS. 20A and 20B, (iv) depositing conductive layer 212C on high-k dielectric layer 212B, as shown in FIGS. 20A and 20B, and (v) performing a CMP process on high-k dielectric layer 212B and conductive layer 212C to substantially coplanarize top surfaces of ESLs 116, ILD layers 120, high-k dielectric layer 212B, and conductive layer 212C with each other, as shown in FIGS. 20A and 20B.

Figure 21A:
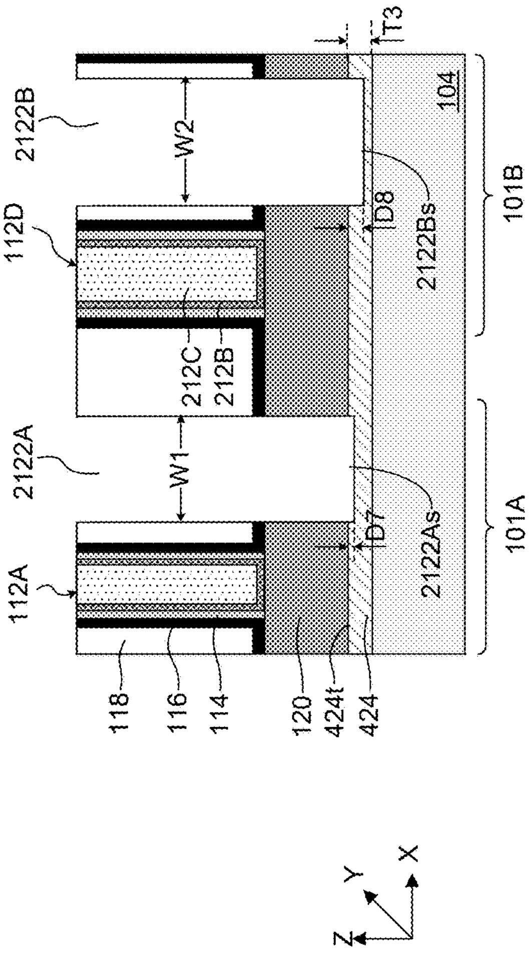
Figure 21B:
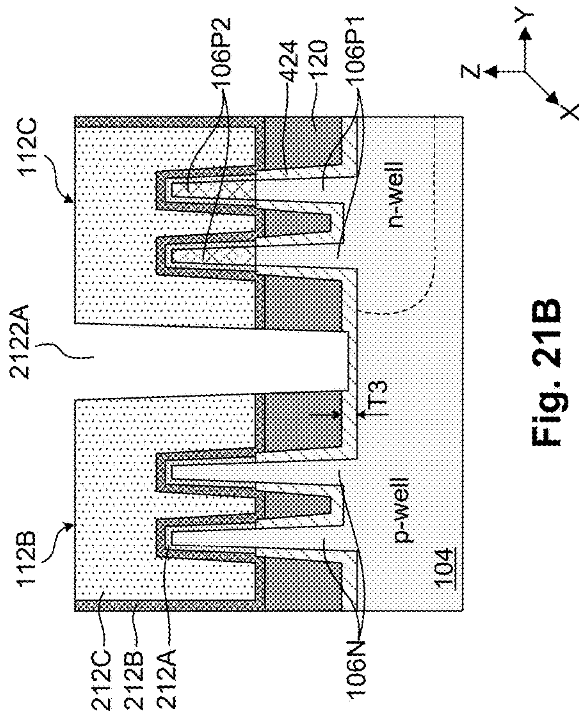
Figure 21C:
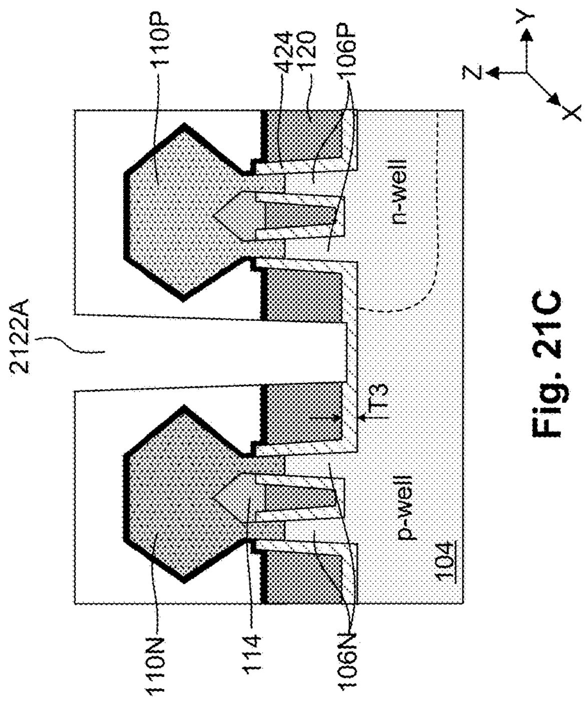
Figure 22A:
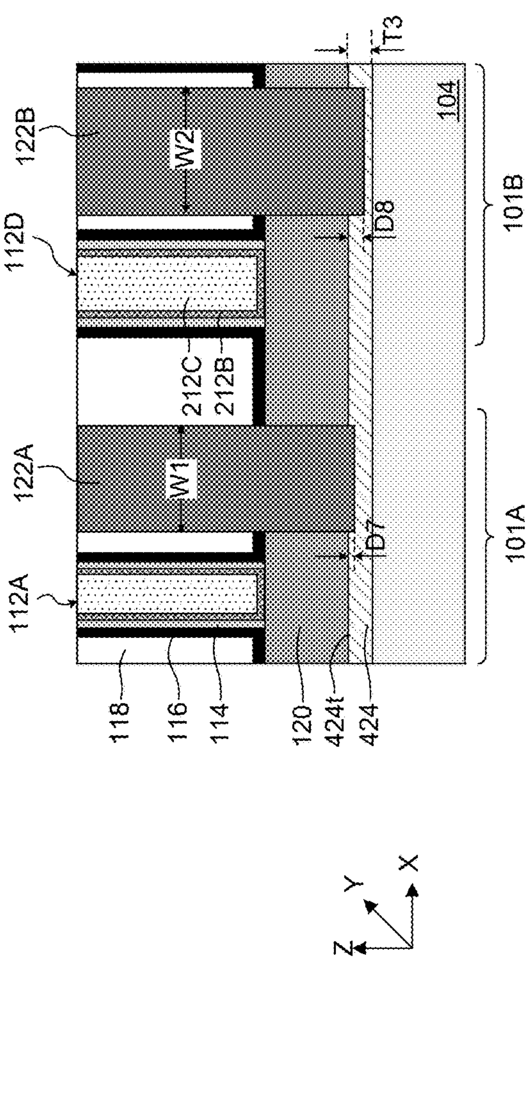
Figure 22B:
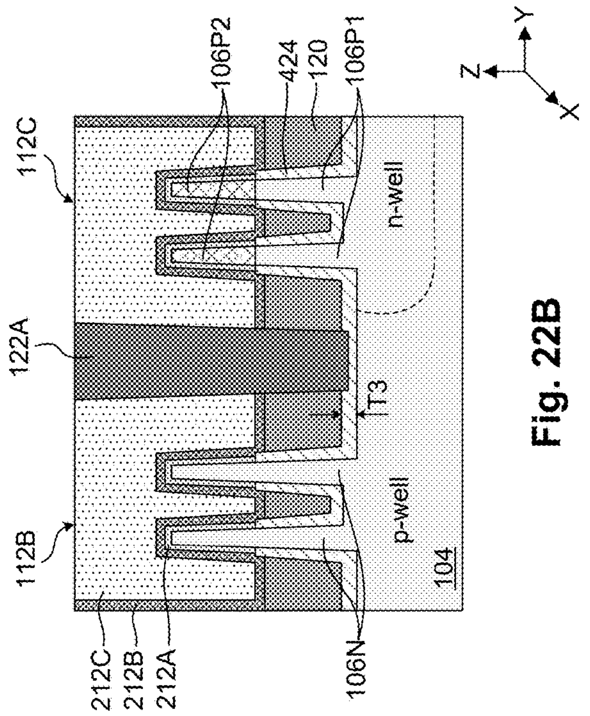
Figure 22C:
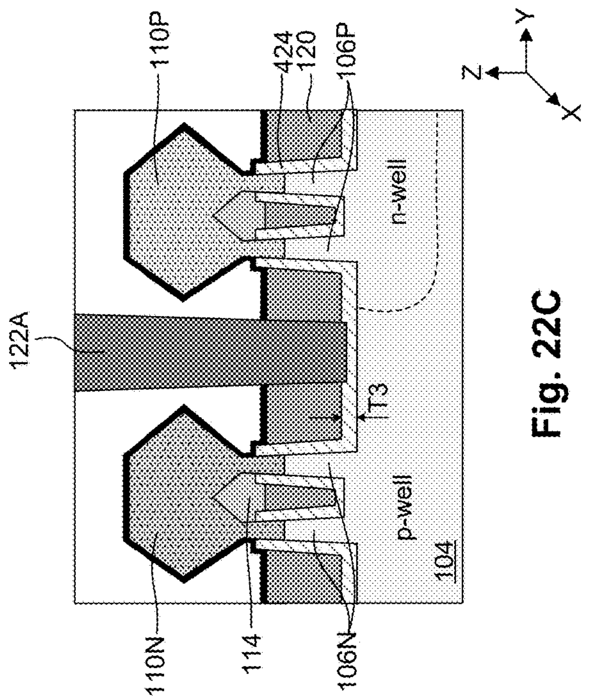

Referring to FIG. 15, in operation 1525, isolation structures are formed to cut the gate structures. For example, as described with reference to FIGS. 21A-21C and 22A-22C, isolation structure 122A is formed to cut gate structure 112BC into gate structures 112B and 112C and isolation structure 122B is formed to cut gate structure 112EF into gate structures 112E and 112F. The formation of isolation structures 122A and 122B can include sequential operations of (i) forming isolation trenches 2122A and 2122B (not visible in FIGS. 21B and 21C), as shown in FIGS. 21A-21C, (ii) depositing a dielectric layer (not shown) having the material of isolation structures 122A and 122B on the structures of FIGS. 21A-21C to fill isolation trenches 2122A and 2122B, and (iii) performing a CMP process on the dielectric layer to substantially coplanarize top surfaces of isolation structures 122A and 122B with top surfaces of ILD layers 118.

The formation of isolation trenches 2122A and 2122B can include performing an etching process to etch redundant gate portions of gate structures 112BC and 112EF between fin structures 106N and 106P and etch redundant dielectric portions, which include portions of gate spacers 114, ESL 116, and ILD layer 118 on the sidewalls of redundant gate portions. The etching process can include a dry etching using an etchant that has a higher etch selectivity for the metallic material of the redundant gate portions than the material of etch control layer 424. Due to the lower etch selectivity of etch control layer 424, the etching rate of the etching process can be significantly reduced after top surfaces 424*t* of etch control layer 424 are exposed in isolation trenches 2122A and 2122B. As a result, the etch depth of isolation trenches 2122A and 2122B can be precisely controlled and prevented from extending into substrate 104. In some embodiments, due to the reduced etching rate at etch control layer 424, substantially planar bottom surfaces 2122As and 2122Bs of isolation trenches 2122A and 2122B can be achieved. The discussion of the cross-sectional profiles and the depth profiles of isolation structures 122A and 122B applies to the cross-sectional profiles and the depth profiles of isolation trenches 2122A and 2122B.

The present disclosure provides example semiconductor devices (e.g., semiconductor device 100) with etch control layers (e.g., etch control layers 224, 324, and 424) between the substrate (e.g., substrate 104) and gate structures (e.g., gate structures 112A-112F) and example methods (e.g., methods 500 and 1500) for fabricating the semiconductor devices. The etch control layer can prevent the isolation trenches (e.g., isolation trenches 1322A, 1322B, 2122A, and 2122B) from extending into the substrate through STI regions (e.g., STI regions 120) during the formation of the isolation structures (e.g., isolation structures 122A and 122B) in the CMG process. In some embodiments, the etch control layer (e.g., etch control layers 224 and 324) can be disposed directly on the STI regions, and bottom surfaces of the isolation structures can be disposed in the etch control layer or in the STI regions. In some embodiments, the etch control layer (e.g., etch control layer 424) can be disposed directly on the substrate and bottom surfaces of the isolation structures can be disposed in the etch control layer. In some embodiments, the etch control layer can have an etch selectivity lower than that of the gate structures to reduce the etching rate of the CMG process after the etching of the gate structures. Reducing the etching rate after the etching of the gate structures can achieve a more precise control of the etch depth of the isolation trenches in the etch control layer and/or in the STI regions compared to that achieved in semiconductor devices without the etch control layers.

In some embodiments, a method includes forming a fin structure having a first fin portion and a second fin portion on a substrate, forming a first dielectric layer on the substrate and on sidewalls of the first fin portion, forming a second dielectric layer on the first dielectric layer, performing an oxidation process on the second fin portion to form an oxide layer, depositing a gate dielectric layer on the oxide layer and on the second dielectric layer, depositing a gate conductive layer on the gate dielectric layer, and forming an isolation structure extending through the gate conductive layer, the gate dielectric layer, and the second dielectric layer.

In some embodiments, a method includes forming a fin structure on a substrate, depositing a first dielectric layer on the fin structure and on the substrate, depositing a second dielectric layer on the first dielectric layer, etching the first and second dielectric layers to expose a top portion of the fin structure, depositing a gate dielectric layer on the top portion of the fin structure, depositing a gate conductive layer on the gate dielectric layer, and forming an isolation structure with a bottom surface in the first dielectric layer.

In some embodiments, a semiconductor device includes a substrate, a STI region disposed on the substrate, an etch control layer disposed on the STI region, first and second fin structures disposed on the substrate, first and second gate structures disposed on the first and second fin structures, respectively, and on the etch control layer, and an isolation structure disposed between the first and second gate structures and in the etch control layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, on a substrate, a fin structure comprising a first fin portion and a second fin portion;

forming a first dielectric layer on the substrate and on sidewalls of the first fin portion;

forming a second dielectric layer on the first dielectric layer;

performing an oxidation process on the second fin portion to form an oxide layer;

depositing a gate dielectric layer on the oxide layer and on the second dielectric layer;

depositing a gate conductive layer on the gate dielectric layer; and forming an isolation structure extending through the gate conductive layer, the gate dielectric layer, and the second dielectric layer.

2. The method of claim 1, wherein forming the isolation structure comprises forming an isolation trench with a bottom surface in the first dielectric layer.

3. The method of claim 1, wherein forming the isolation structure comprises forming an isolation trench with a bottom surface in the second dielectric layer.

4. The method of claim 1, wherein forming the isolation structure comprises:

etching the gate conductive layer, the gate dielectric layer, and the second dielectric layer to expose a top surface of the first dielectric layer; and depositing a dielectric material on the top surface of the first dielectric layer.

5. The method of claim 1, wherein forming the isolation structure comprises forming an isolation trench with at least a distance of about 10 nm between a bottom surface of the isolation trench and a top surface of the substrate.

6. The method of claim 1, wherein forming the isolation structure comprises forming an isolation trench with a rectangular cross-sectional profile along a first plane and a trapezoidal cross-sectional profile along a second plane that is perpendicular to the first plane.

7. The method of claim 1, wherein forming the isolation structure comprises forming an isolation trench with vertical sidewalls along a first plane and sloped sidewalls along a second plane that is perpendicular to the first plane.

8. The method of claim 1, wherein forming the first dielectric layer comprises depositing an oxide layer on the substrate and on the fin structure.

9. The method of claim 1, wherein forming the second dielectric layer comprises depositing a nitride layer on the first dielectric layer.

10. The method of claim 1, wherein forming the fin structure comprises:

depositing a silicon germanium layer on the substrate;

etching the silicon germanium layer to form the second fin portion; and etching the substrate to form the first fin portion.

11. A method, comprising:

forming a fin structure on a substrate;

depositing a first dielectric layer on the fin structure and on the substrate;

depositing a second dielectric layer on the first dielectric layer;

etching the first and second dielectric layers to expose a top portion of the fin structure;

depositing a gate dielectric layer on the top portion of the fin structure;

depositing a gate conductive layer on the gate dielectric layer; and forming an isolation structure with a bottom surface in the first dielectric layer.

12. The method of claim 11, wherein depositing the first dielectric layer comprises depositing a nitride layer on the fin structure and on the substrate.

13. The method of claim 11, wherein depositing the second dielectric layer comprises depositing an oxide layer on the first dielectric layer.

14. The method of claim 11, wherein etching the first and second dielectric layers comprises substantially coplanarizing a top surface of a fin-sidewall portion of the first dielectric layer with a top surface of the second dielectric layer.

15. The method of claim 11, wherein forming the isolation structure comprises etching the gate conductive layer, the gate dielectric layer, and the second dielectric layer to expose a top surface of the first dielectric layer.

16. The method of claim 11, wherein forming the isolation structure comprises forming an isolation trench with a rectangular cross-sectional profile along a first plane and a trapezoidal cross-sectional profile along a second plane that is perpendicular to the first plane.

17. A method, comprising:

forming a fin structure on a substrate;

depositing a nitride layer on the fin structure and on the substrate;

depositing an oxide layer on the nitride layer;

etching the nitride layer to expose a top portion of the fin structure;

etching the oxide layer to expose sidewalls of the nitride layer;

depositing a gate dielectric layer on the top portion of the fin structure and on the nitride layer;

depositing a gate conductive layer on the gate dielectric layer and on the exposed sidewalls of the nitride layer; and forming an isolation structure extending from a top surface of the gate conductive layer to the nitride layer.

18. The method of claim 17, wherein forming the isolation structure comprises etching the gate conductive layer, the gate dielectric layer, the oxide layer, and the nitride layer.

19. The method of claim 17, wherein forming the isolation structure comprises forming an isolation trench with vertical sidewalls along a first plane and sloped sidewalls along a second plane that is perpendicular to the first plane.

20. The method of claim 17, further comprising planarizing top surfaces of the oxide layer and the nitride layer prior to etching the nitride layer.

* * * * *